United States Patent [19]
Takita et al.

[11] Patent Number: 6,151,265
[45] Date of Patent: Nov. 21, 2000

[54] MEMORY DEVICE HAVING DIRECT SENSE CIRCUIT

[75] Inventors: Masato Takita; Masato Matsumiya, both of Kawasaki, Japan

[73] Assignee: Fujitsu Limited, Kawasaki, Japan

[21] Appl. No.: 09/332,876

[22] Filed: Jun. 15, 1999

[30] Foreign Application Priority Data

Jun. 30, 1998 [JP] Japan .................................. 10-185438

[51] Int. Cl.[7] ...................................................... G11C 8/00
[52] U.S. Cl. ...................................... 365/230.03; 365/205
[58] Field of Search .............................. 365/230.03, 203, 365/205, 207, 208

[56] References Cited

U.S. PATENT DOCUMENTS 5,831,919  11/1998  Haunkness et al. ..................... 365/205
5,881,006  3/1999  Yabe et al. ................................ 365/207
6,026,034  2/2000  Suzuki et al. ............................ 365/190

*Primary Examiner*—David Nelms
*Assistant Examiner*—David Lam
*Attorney, Agent, or Firm*—Arent Fox Kintner Plotkin & Kahn PLLC

[57] ABSTRACT

A direct-sense activation circuit 20 is provided for a sense circuit row 12A. When a memory block 0 is activated, the direct-sense activation circuit 20 activates a direct-sense driving line in response to an activated read signal from the control circuit 18. The direct sense circuit is provided with a direct sense gate which is controlled by the voltage of a bit line and a column gate connected to the direct sense gate in series between the direct-sense driving line and a read-data bus line. A plurality of memory blocks are disposed in the direction perpendicular to the sense circuit row 12A, a column decoder 13 and a sense buffer circuit 15 are disposed so that these memory blocks are placed therebetween, and the word decoders are disposed on a side of the respective memory blocks.

14 Claims, 21 Drawing Sheets

MEMORY DEVICE HAVING DIRECT SENSE CIRCUIT

BACKGROUND OF THE INVENTION

1. Field of the Invention

The present invention relates to a memory device provided with direct sense circuits and a plurality of semi-parallelly accessible memory blocks such as a synchronous dynamic random access memory (SDRAM) with multi-banks and a semiconductor device having the same.

2. Description of the Related Art

FIG. 18 shows a schematic layout pattern of the core part of a prior art. The core part is provided with banks 0 through 3 for a high speed processing with semi-parallel operations. A bank address, a block address and a row address from the outside is predecoded by a predecoder 10, it is further decoded by a word decoder 11, and for example, one row in the memory block, of a bank 0, formed between rows 12A and 12B of sense circuits including sense amplification circuits, etc., is selected with a word line WL. The memory content on this row is read out on a bit line and is amplified by the sense circuit rows 12A and 12B. More concretely, for example, the memory content of a memory cell 14 is read out on a bit line BL and is amplified by a sense amplification circuit 122 in the sense circuit row 12B. A column address from the outside is decoded by a column decoder 13A, and for example, a column gate selected in the sense circuit row 12B turns on by a column selection line CL, whereby the data on the bit line BL is read out onto a local data bus LDB, further on to a global data bus GDB and is amplified in the sense buffer circuit 15A.

However, it is necessary to provide column decoders 13A through 13D in the banks 0 through 3, respectively. Further, it is necessary to provide a sense buffer circuit 15B disposed between the bank 1 and bank 3 in addition to the sense buffer circuit 15A disposed between the bank 0 and bank 2. Therefore, the chip area is increased or the storage capacity is suppressed. Furthermore, since it is necessary to form address lines from an address buffer register to each of the column decoders 13A through 13D, the operation speed is decreased.

FIG. 19 shows the first improvement on FIG. 18 to solve these problems.

In the core part, banks 0 through 3 are disposed in a column, and a column decoder 13 and a sense buffer circuit 15 are disposed so that the banks 0 through 3 are placed therebetween. Column gates of the same column of the banks 0 through 3 are simultaneously selected with a column selection line CL connected to the output of the column decoder 13. If a global data bus GDB is made common for the banks 0 through 3, data on the global data bus GDB are brought into collision with each other when a plurality of banks are activated at the same time. Therefore, the global data bus GDB is provided for each of the banks and it is necessary that each global data bus is connected to the sense buffer circuit 15. Further, since a longer global data bus GDB than that in the case of FIG. 18 is used for each of a plurality of banks operating in semi-parallel, consumption power is increased.

FIG. 20 shows the second improvement in which a global data bus GDB is made common for banks 0 through 3.

In this case, in order that data are read out from a plurality of activated banks in time sharing and are not brought into collision with each other on the global data bus GDB, as regards each column of the banks 0 through 3, it is necessary to provide an independent column selection line CL for each of the banks. Therefore, the wiring pitch of the column selection line CL becomes one-fourth that of the prior art, such shortcomings as short-circuit between wires are likely to occur. If it is attempted to avoid this, the chip area is increased.

In order to solve these shortcomings, as shown in FIG. 21, if column decoders 13A through 13D are provided for each of the banks 0 through 3, the pattern becomes similar to that of the prior art structure of FIG. 18.

SUMMARY OF THE INVENTION

Accordingly, an object of the present invention is to provide a memory device having a direct sense circuit, in which a common use of a column decoder and a sense buffer circuit is possible with a plurality of semi-parallelly accessible memory blocks by adding a simple structure thereto.

In the 1st aspect of the present invention, there is provided a memory device comprising: a plurality of memory blocks to be activated independently to each other, each memory block having memory cell array arranged in rows and columns and including a bit line coupled to a plurality of memory cells; a direct sense circuit coupled between a read-data bus line and the bit line, the direct sense circuit being activated with activating a direct-sense driving line; a control circuit for generating a read signal activated for a predetermined time in response to a read command; and a direct-sense activation circuit for activating the direct-sense driving line in response to the activated read signal when a corresponding one of the memory blocks is activated.

With the present invention, since a column gate remains a off state even if a column selection line is activated when a direct-sense driving line is inactive, a column decoder and a sense buffer circuit are commonly used for a plurality of memory blocks, and even if a plurality of memory blocks, for example, memory banks are accessed in semi-parallel, data collision on the data bus can be avoided if the period in which the direct-sense driving line is active differs among memory blocks.

Other aspects, objects, and the advantages of the present invention will become apparent from the following detailed description taken in connection with the accompanying drawings.

DESCRIPTION OF THE PREFERRED EMBODIMENTS

Figure 1:
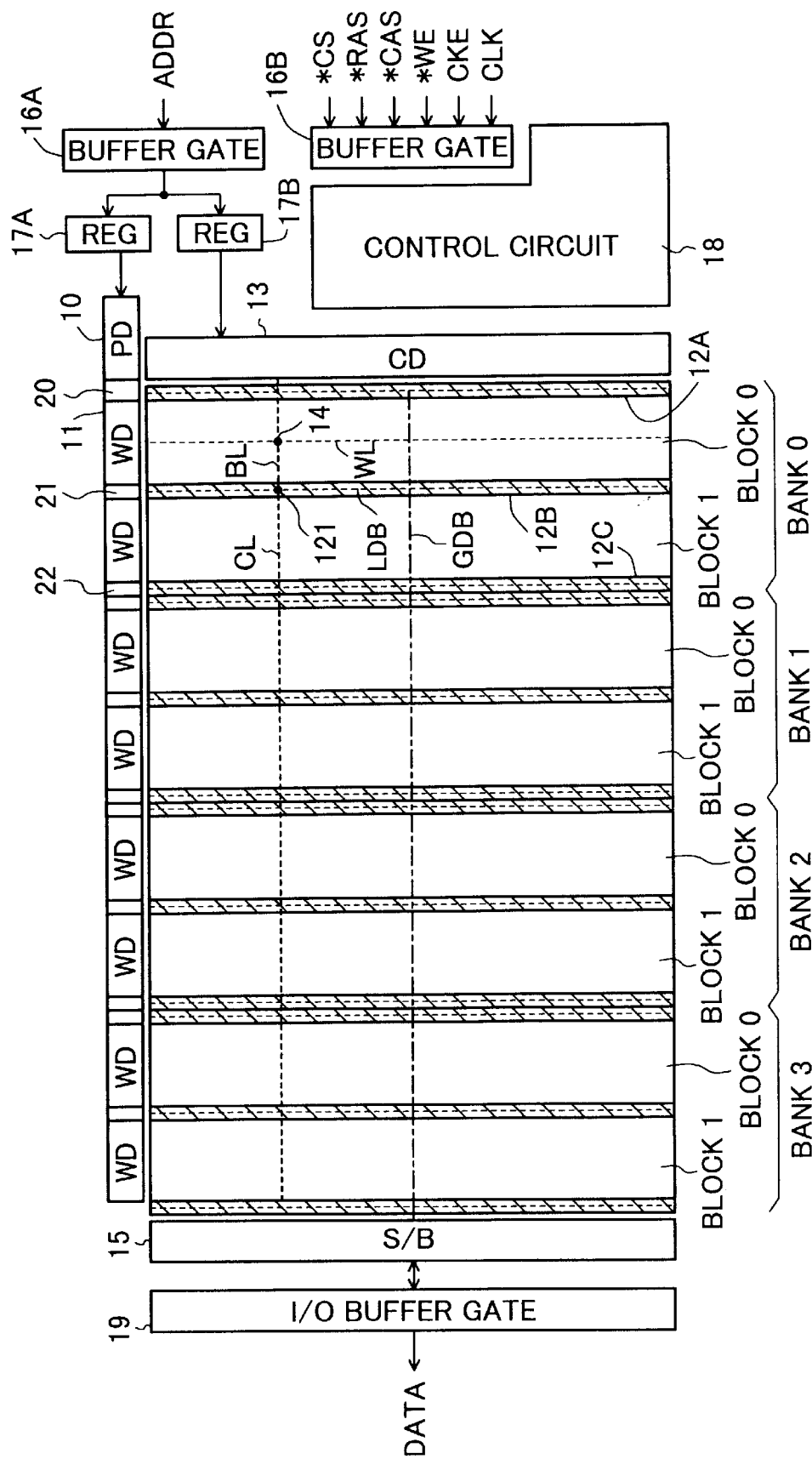
FIG. 1 is a schematic layout pattern of a synchronous DRAM according to the first embodiment of the present invention.

Referring now to the drawings, wherein like reference characters designate like or corresponding parts throughout several views, preferred embodiments of the present invention are described below.

First Embodiment

FIG. 1 shows a schematic layout pattern of a synchronous DRAM according to the first embodiment of the present invention.

In this synchronous DRAM, banks 0 through 3 are arranged in the direction perpendicular to sense circuit rows, and a column decoder 13 and a sense buffer circuit 15 are disposed so that the banks 0 through 3 are placed therebetween.

The bank 0 is provided with sense circuit rows 12A, 12B and 12C, a memory block 0 between the sense circuit rows 12A and 12B, and a memory block 1 between the sense circuit rows 12B and 12C. A word decoder is provided for each memory block. For example, the word decoder 11 is provided for the memory block 0 in the bank 0. The memory block 1 is the same as the memory block 0 except the address range. Each of the banks 1 through 3 is the same as the bank 0 except the address range.

An address ADDR from the outside is provided via a buffer gate 16A for a signal level interface into address buffer registers 17A and 17B. A chip selection signal *CS from the outside (where an asterisk * indicates that the signal is active when it is low), a row address strobe signal *RAS, a column address strobe signal *CAS, a write enable signal *WE, a clock enable signal CKE and a clock signal CLK are provided via a buffer gate 16B into a control circuit 18.

The control circuit 18 generates various control signals in response to commands defined by combinations of control signals *CS, *RAS, *CAS, *WE and CKE and parts of addresses at a rise time of CLK. For example, the control circuit 18 causes the address buffer register 17A to hold a bank address, an in-bank block address, and an in-bank row address with providing an activated latch signal to the clock input of the address buffer register 17A in response to an issuance of an activation command ACT. The output of the address buffer register 17A is predecoded by a predecoder 10, and further decoded by word decoders including a word decoder 11, whereby a word line WL in the selected bank, block and section is caused to rise.

Figure 2:
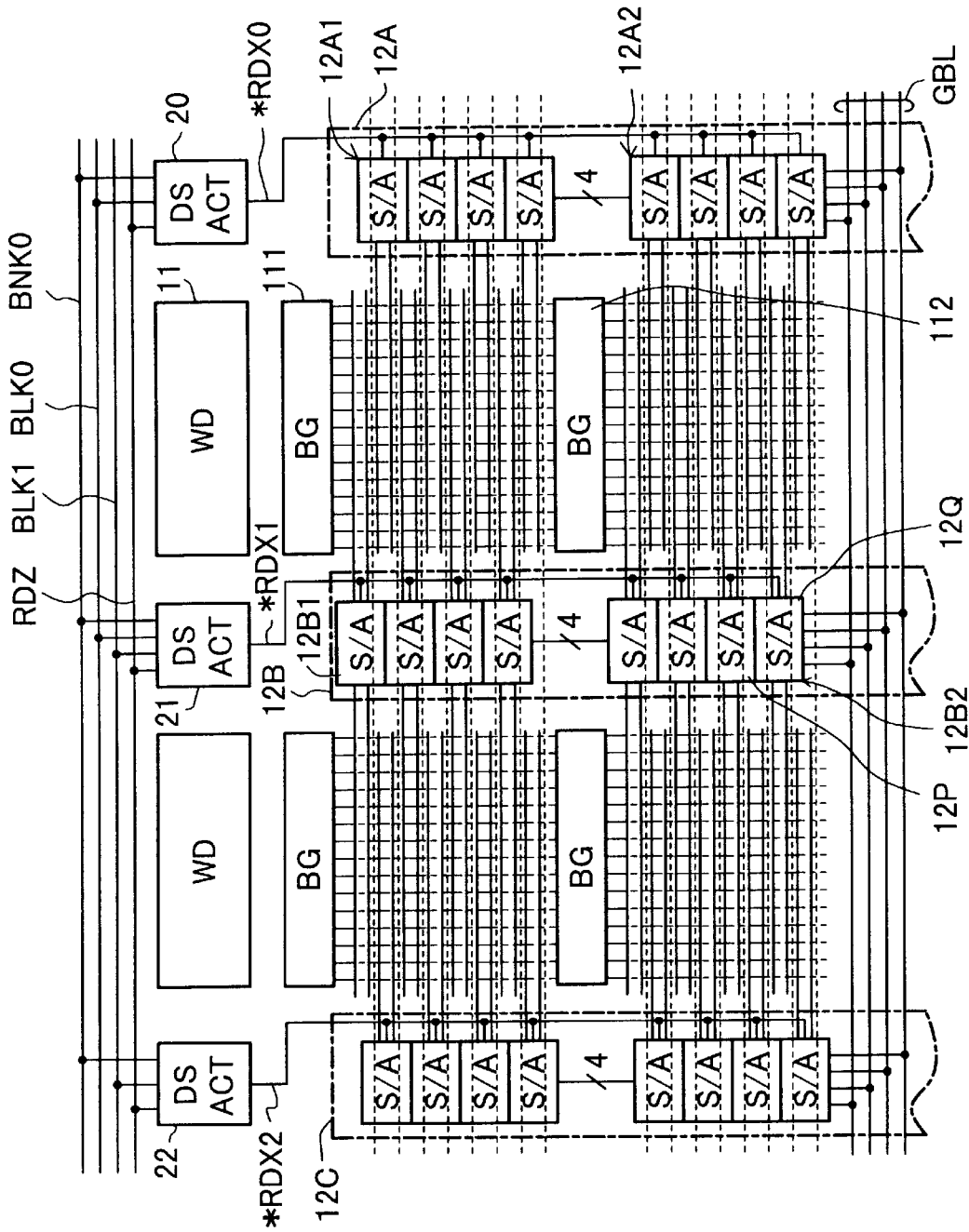
FIG. 2 is a block diagram showing a part of the bank 0 in FIG. 1.

FIG. 2 shows a part of the bank 0 of FIG. 1.

Sense circuit groups 12A1 and 12A2 are parts of the sense circuit row 12A, and sense circuit groups 12B1 and 12B2 are parts of the sense circuit row 12B. For the purpose of simplification, FIG. 2 shows a case where each sense circuit group consists of four sense circuits S/A. A memory cell array (not shown) is divided into sections with boundary lines (not shown) perpendicular to the sense circuit rows. The width of each section corresponds to the length of the sense circuit groups 12A1. For example, a memory cell sub-array between the sense circuit groups 12A1 and 12B1 is identified by an address of bank 0, block 0 and section 0, a memory cell sub-array between the sense circuit groups 12A2 and 12B2 is identified by an address of bank 0, block 0, and section 1, and this is similarly applied to the other memory cell sub-arrays.

A buffer gate circuit for amplifying the driving power of a word line is disposed for each memory cell sub-array. The output of the word decoder 11 is provided to the input of all the buffer gate circuits, including the buffer gates 111 and 112, in the same memory block, and the output of each buffer gate circuit is provided to word lines in the corresponding memory cell sub-array. The alternate long and short dashed lines in FIG. 2 indicate word lines, the dotted lines are column selection lines, and the solid lines extending in the left and right directions from the sense circuits are bit lines.

Figure 3:
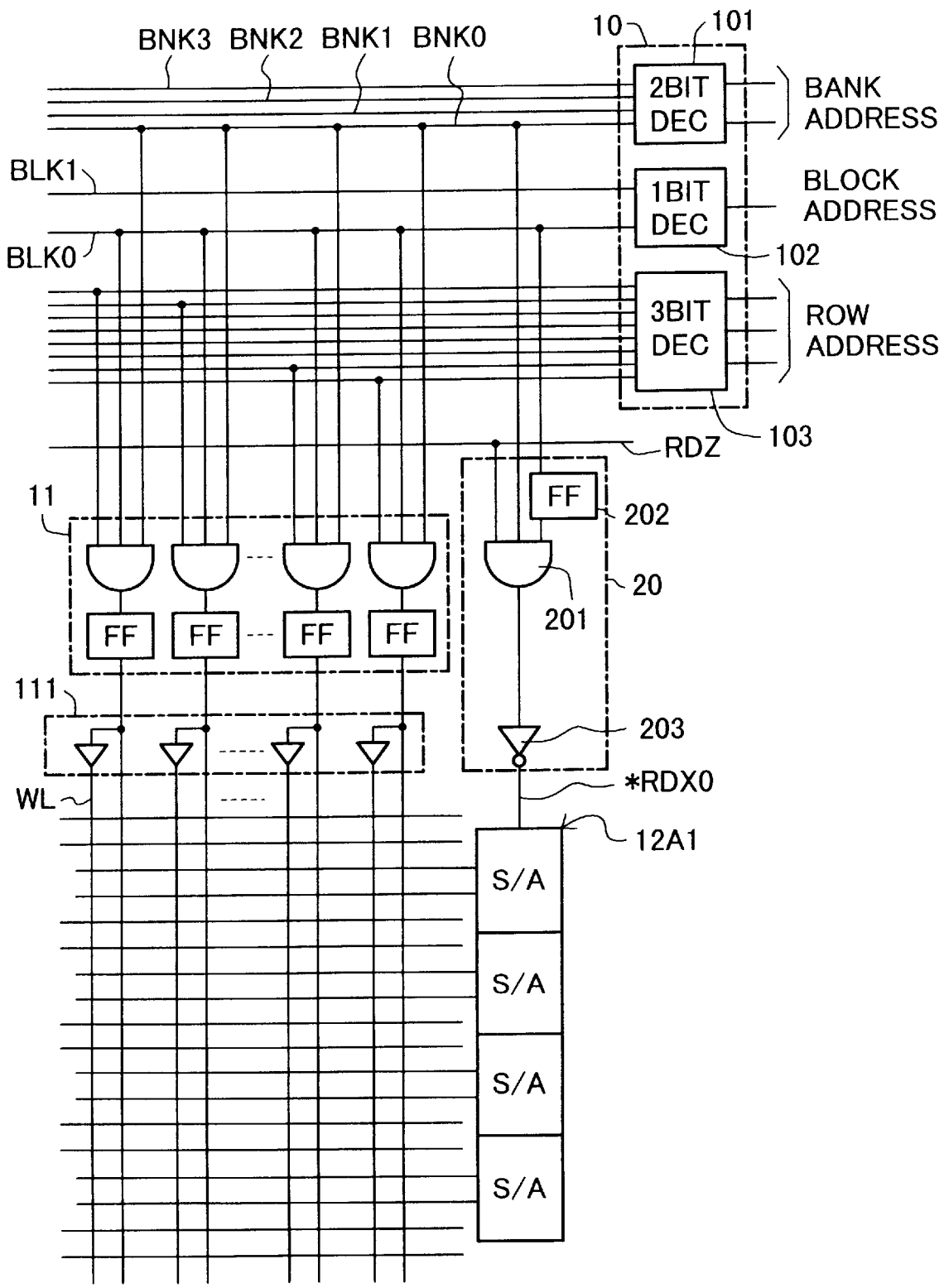
FIG. 3 is a circuit diagram showing a structure example of a part of FIG. 1.

FIG. 3 shows a structure example of the periphery of the memory cell sub-array of bank 0, block 0, and section 0. For simplification, FIG. 3 shows a case where the number of row addresses is three bits.

In the predecoder 10, a bank address is decoded by a 2-bit decoder 101 to generate bank selection signals BNK0 through BNK3, a block address is decoded by a 1-bit decoder 102 to generate block selection signals BLK0 and BLK1, and a row address is decoded by a 3-bit decoder 103.

The word decoder 11 is provided with eight three-input AND gates for causing a word line WL corresponding to the output of the 3-bit decoder 103 to rise when the bank 0 and block 0 are selected, and eight RS flip-flops (FFs) for holding the respective outputs of the AND gates, which enables semi-parallel access of a plurality of banks.

Referring back to FIG. 1, the storage content of a cell row along the word line WL is read out onto the bit lines in response to a rise of the word line WL, and is amplified by the sense circuit rows 12A and 12B.

More concretely, for example, the content of the memory cell 14 is read out onto the bit line BL and is amplified by a sense amplification circuit 121 in the sense circuit row 12B.

The control circuit 18 causes the address buffer register 17B to hold a section address and an in-section column address with providing an activated latch signal to the clock input of the address buffer register 17B in response to issuance of a read command. The output of the address buffer register 17B is decoded by a column decoder 13, and the selected column gate is caused to turn on with the selected column selection line CL being activated.

Thereby, the data on the bit line BL is read out on a local data bus LDB along the sense circuit row, goes through a global data bus GDB perpendicular thereto, and is amplified by a sense buffer circuit 15A. The output of the sense buffer circuit 15 is provided to an I/O buffer gate circuit 19 for a signal level interface, and is taken out to the outside as DATA.

Figure 4:
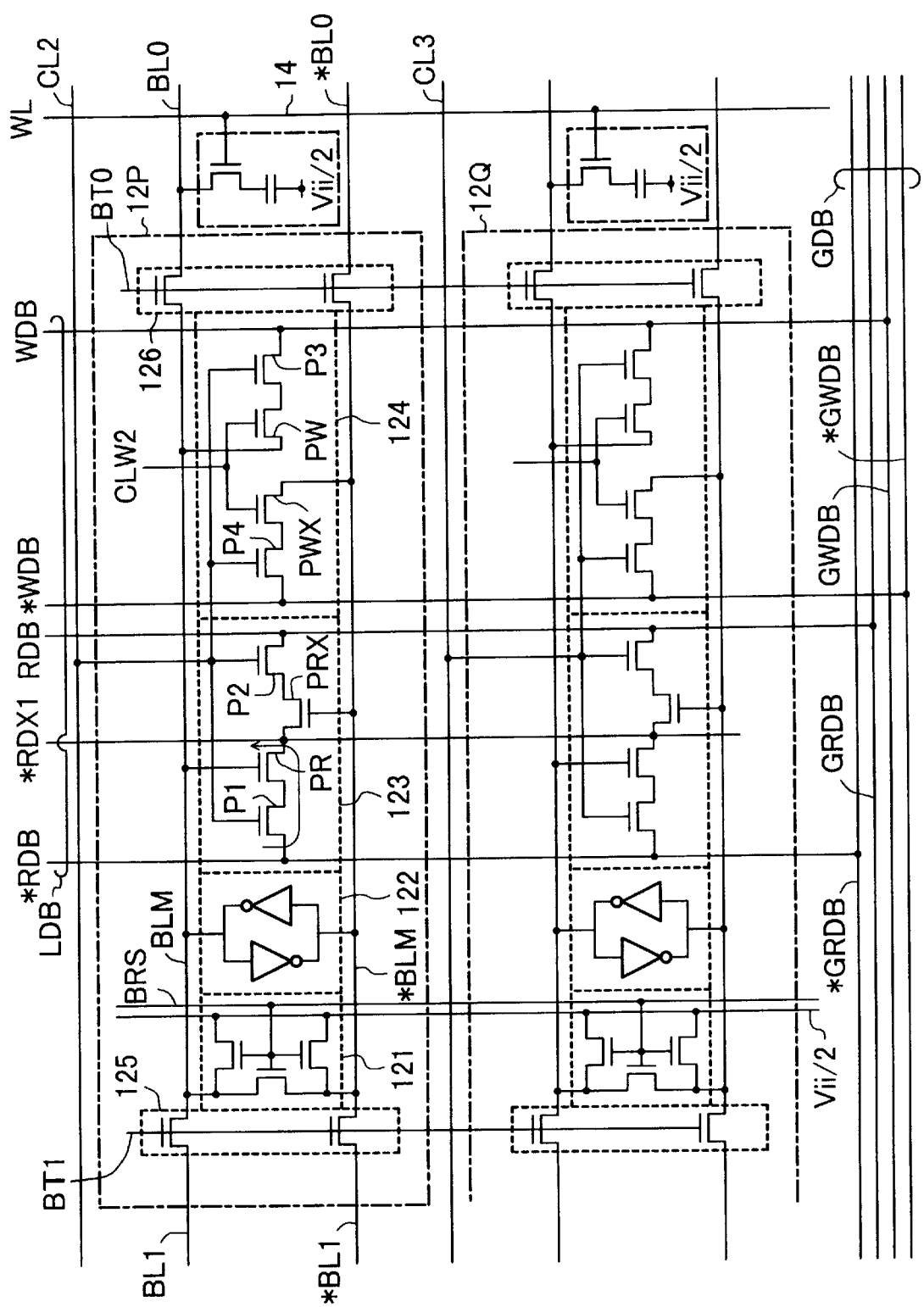
FIG. 4 is a circuit diagram showing a structure example of a part of a group of sense circuits in FIG. 2.

FIG. 4 shows a structure example of sense circuits 12P and 12Q in FIG. 2. Although the sense circuits 12P and 12Q are of the same structure to each other, the sense circuit 12Q is included in FIG. 4 to express the connection relationship between them.

In the sense circuit 12P, a precharge circuit 121, a sense amplification circuit 122, a direct sense circuit 123 and column gate circuit 124 are connected between complementary bit lines BLM and *BLM. Bit lines BL1 and *BL1 of the block 1 are connected to one end of the bit lines BLM and *BLM via a transfer gate 125, and bit lines BL0 and *BL0 of the block 0 are connected to the other end of the bit lines BLM and *BLM via a transfer gate 126. The sense circuit of the sense circuit row 12A of FIG. 1 is the same as the sense circuit 12P if the transfer gate 126 is omitted therefrom. The sense circuit of the sense circuit row 12C of FIG. 1 is the same as the sense circuit 12P if the transfer gate 125 is omitted therefrom. The transfer gate 125 is turned on if the block 1 is selected, and the transfer gate 126 is turned on when the block 0 is selected.

In the sense circuit 12P, the sense amplification circuit 122 is composed of CMOS transistors and others are composed of NMOS transistors for high integration.

The precharge circuit 121 causes the bit lines BLM and *BLM to be short-circuited with making the bit line reset signal BRS high, and applies a voltage Vii/2, which is half the internal power supply voltage Vii, to the bit lines BLM and *BLM. The sense amplification circuit 122 is of a flip-flop type, which is made active or inactive with making a control signal row (not shown).

In the direct sense circuit 123, a column gate P1 and a direct sense gate PR are connected in series between a read-data bus line *RDB and a direct-sense driving line *RDX1, and a column gate P2 and a direct sense gate PRX are connected in series between a read-data bus line RDB and the direct-sense driving line *RDX1. The gate electrodes of the direct sense gates PR and PRX are connected to the bit lines BLM and *BLM, respectively and the gate electrodes of the column gates P1 and P2 are connected to the column selection line CL2.

The read-data bus lines RDB and *RDB are precharged to be high by the sense buffer circuit 15 in FIG. 1. The direct-sense driving line *RDX1 is usually made high. In this state, even if the column selection line CL2 is selected to become high, the column gates P1 and P2 remain off. Therefore, when access is gained to a plurality of banks in semi-parallel, data collision on the data bus can be avoided if the period in which the direct-sense driving line becomes low is different among banks. If the column selection line CL2 is selected to become high in a state where the direct-sense driving line *RDX1 is made low, the column gates P1 and P2 turn on, whereby current responsive to the voltage of BLM0 and *BLM0 flows through the direct sense gates PR and PRX to the direct-sense driving line *RDX1.

In the column gate circuit 124, a write gate PW and a column gate P3 are connected in series between a bit line BLM and a write data bus line WDB, and a write gate PWX and a column gate P4 are connected in series between a bit line *BLM and a write data bus line *WDB. The gate electrodes of the column gates P3 and P4 are connected to the column selection line CL2. A write signal CLW2 is provided to the gate electrodes of the write gates PW and PWX. When carrying out a read, the write signal CLW2 is low and the write gates PW and PWX are off. When carrying out a write, the signal CLW2 is high and the write gates PW and PWX are on. If the column selection line CL2 is selected to become high, the column gates P1 through P4 turn on.

The read data bus RDB and *RDB, and write data bus WDB and *WDB constitute the above-described local data bus LDB, and are connected to the lines GRDB, *GRDB, GWDB and *GWDB of the global data bus GDB, respectively.

Referring back to FIG. 1, direct-sense activation circuits 20, 21, and 22 are respectively formed at one end side of the sense circuit row 12A, 12B and 12C in the lengthwise direction. Each of the direct-sense activation circuits 20, 21 and 22 is for activating the corresponding direct sense circuit with making its direct-sense driving line low, for example, the line *RDX1 in FIG. 4 low in the period of one clock cycle in response to a read command after the corresponding sense circuit row has been activated.

Figure 5:
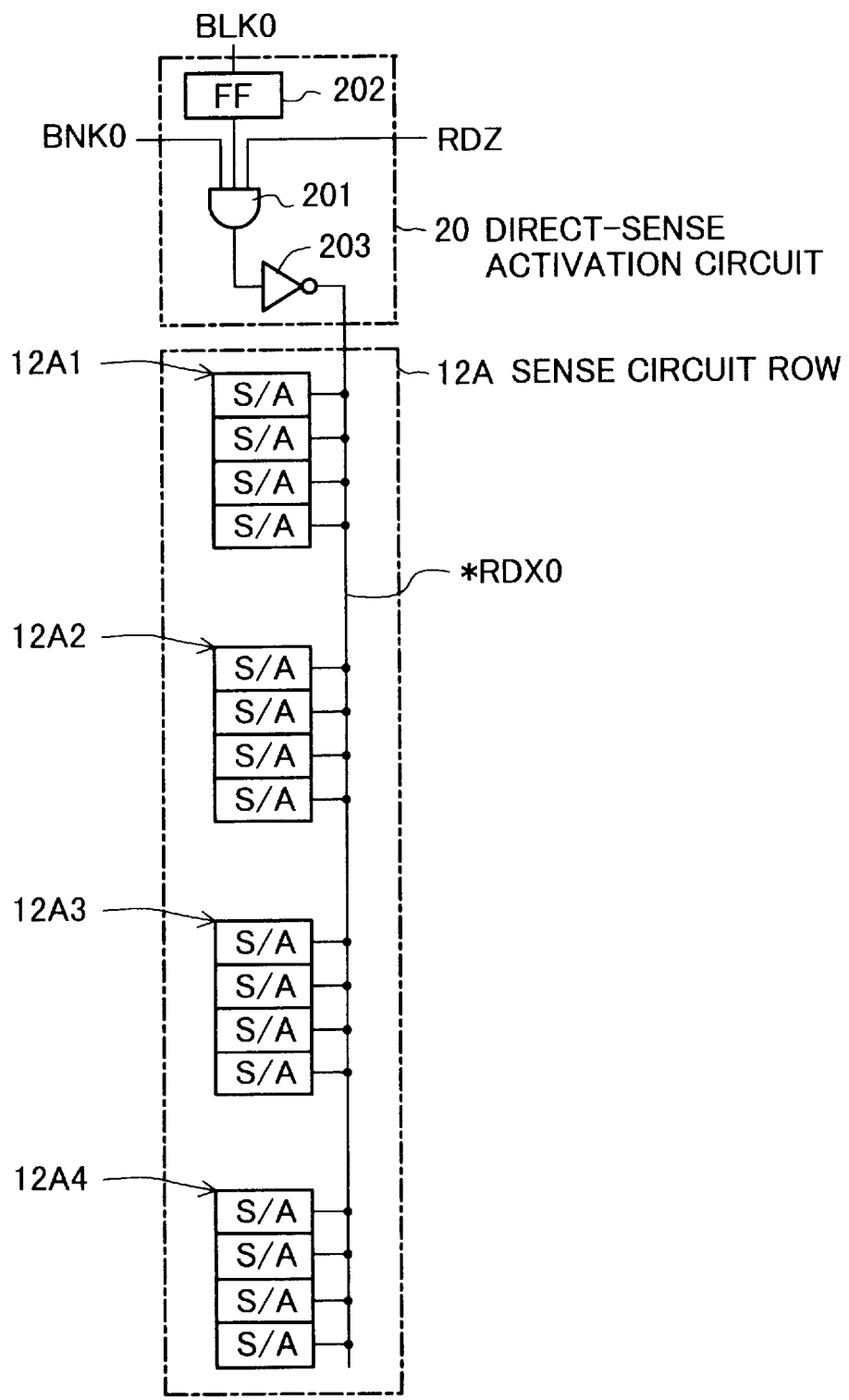
FIG. 5 is a circuit diagram showing a sense circuit row in FIG. 1 and a direct-sense activation circuit for the column.
Figure 7:
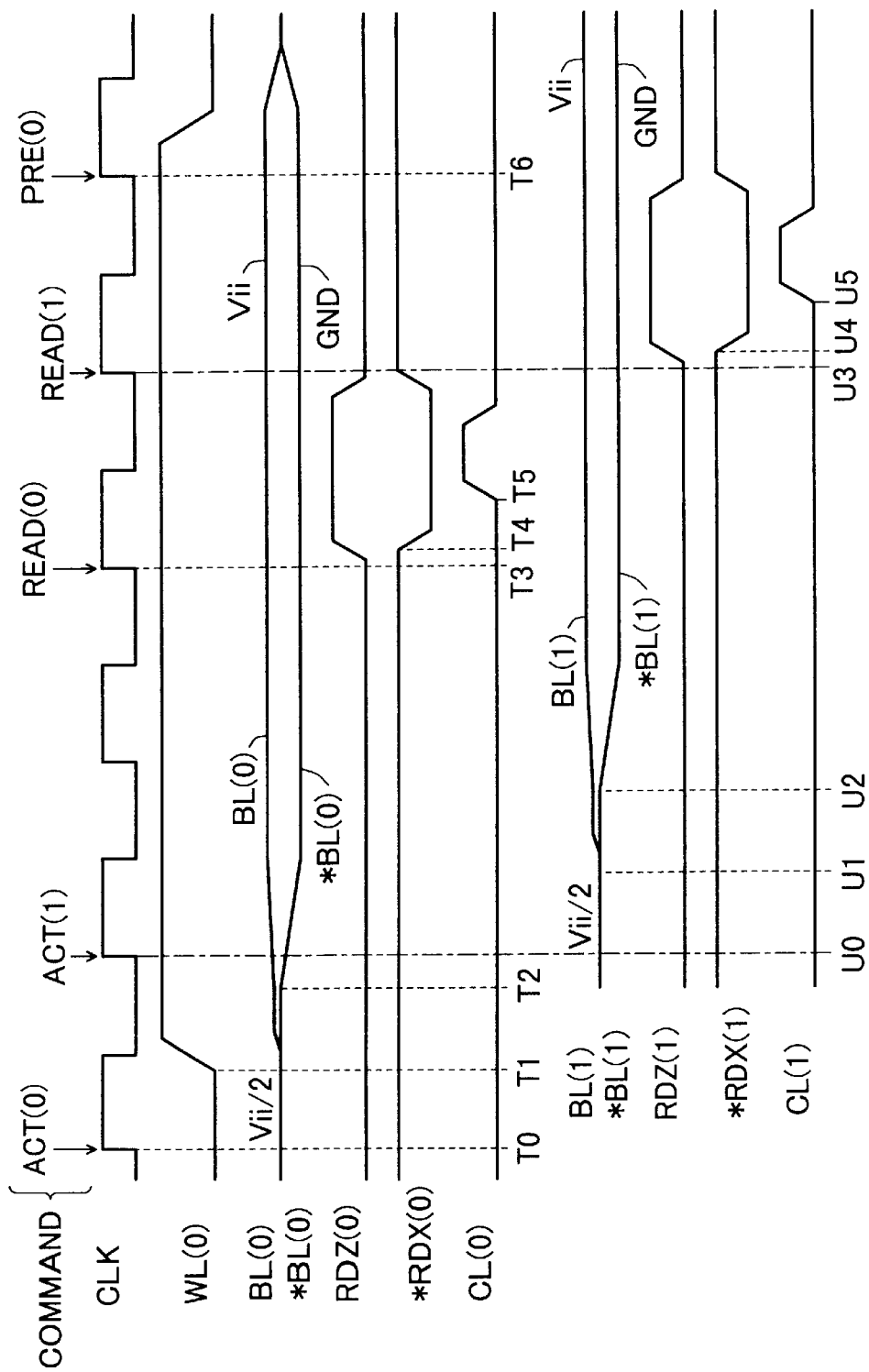
FIG. 7 are time charts showing operations in a case where access to different banks successively arise.

In the direct-sense activation circuit 20, for example, as shown in FIG. 5, a bank selection signal BNK0 and a read signal RDZ are provided to the AND gate 201, and further the block selection signal BLK0 held by a flip-flop is provided thereto. An inverter 203 is connected to the output of the AND gate 201. The read signal RDZ is generated by the control circuit 18 in FIG. 1, and as shown in FIG. 7, the read signal RDZ becomes high in the period of one clock cycle in response to the read command.

Figure 6:
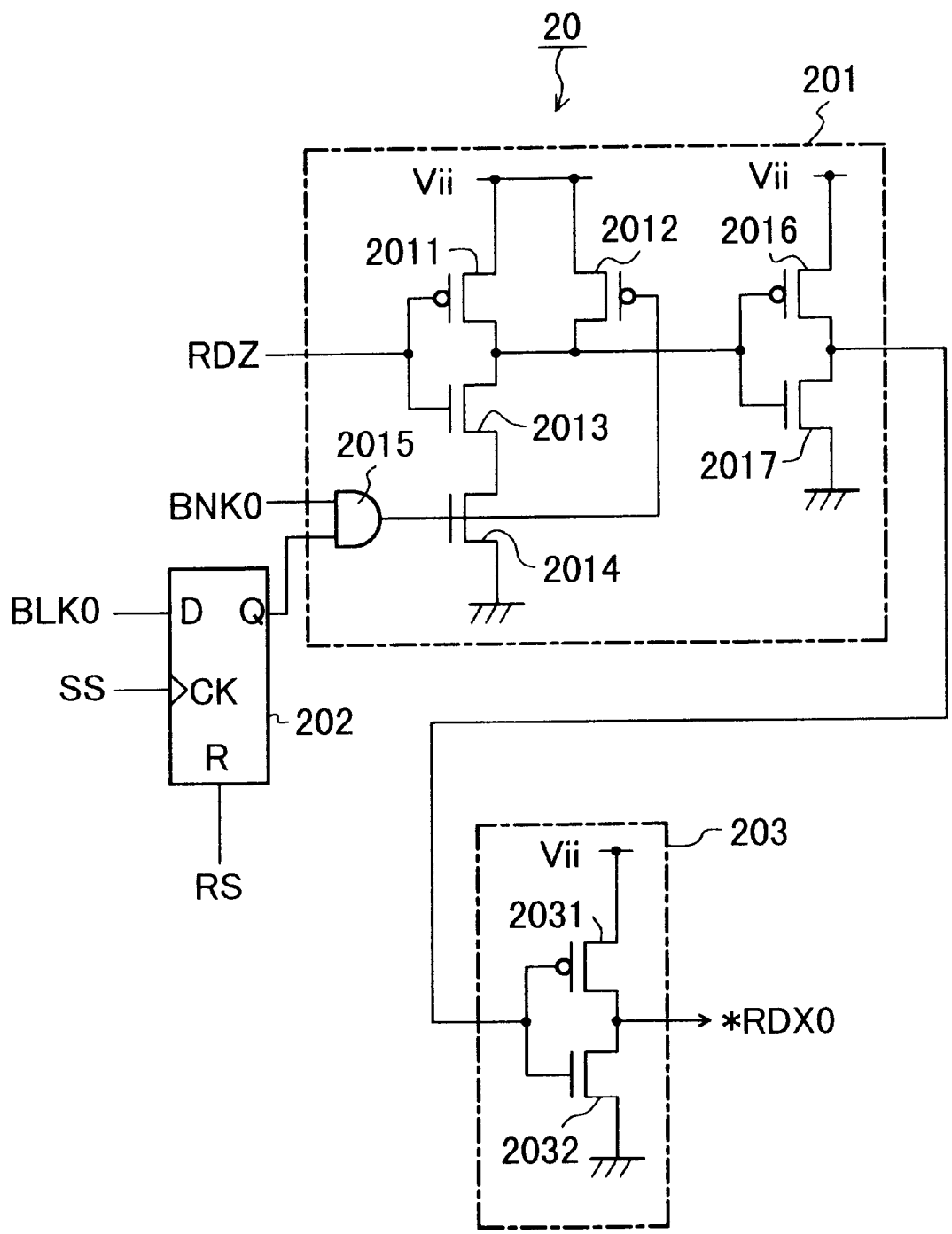
FIG. 6 is a circuit diagram showing a structure example of the direct-sense activation circuit in FIG. 5.

The direct-sense activation circuit 20 is, for example, a CMOS circuit constructed as shown in FIG. 6. In FIG. 6, 2011, 2012, 2016 and 2031 each are PMOS transistors while 2013, 2014, 2017 and 2032 each are NMOS transistors. The output of the AND gate 2015 is connected to the gates of the NMOS transistor 2014 and PMOS transistor 2012. The read signal RDZ is provided to the gate of the PMOS transistors 2011 and 2013. The bank selection signal BNK0 and the block selection signal BLK0 held in a D flip-flop circuit 202 are provided to the AND gate 2015. The D flip-flop circuit 202 holds the signal BNK0 on a rise of a set signal SS described below, and the output thereof is made low by a reset signal RS being high. The transistor size of a inverter 203 is greater than that of the AND gate 201.

In FIG. 5, a direct-sense activation signal *RDX0 is taken out of the output of the direct-sense activation circuit 20 and is provided to the direct sense circuits, in the same manner as *RDX1 in FIG. 5, in the respective sense circuits S/A in the sense circuit row 12.

With such a structure, the direct-sense activation circuit 20 causes the direct-sense activation signal *RDX0 (direct-sense driving line) to be low in a period of one clock cycle in response to a read command after the block 0 in the bank 0 has been selected.

Similarly, in FIG. 2, the direct-sense activation circuit 21 causes the direct-sense activation signal *RDX1 to be low in a period of one clock cycle in response to a read command after the block 0 or 1 in the bank 0 has been selected. The direct-sense activation circuit 22 causes a direct-sense activation signal *RDX2 to be low in a period of one clock cycle in response to a read command after the block 1 in the bank 0 has been selected. The outputs *RDX1 and *RDX2 of the direct-sense activation circuits 21 and 22 are connected to the direct sense circuits in the respective sense circuits S/A in the sense circuit row 12B and 12C in the same manner as described above.

Next, with reference to FIG. 7, a description will be given of the operations of the present first embodiment constructed as described above.

FIG. 7 shows a case where access to the bank 1 starts in one clock cycle after the access to the bank 0 has started. The numbers in the brackets in the time charts denote bank numbers.

As a initial state, the bit line is precharged to a voltage Vii/2 and the local data bus LDB and the global data bus GDB are precharged to a voltage Vii.

(1) Operation in Response to an Activation Command ACT(0)

In response to an issuance of an activation command ACT(0) at a time T0 of a rise of the clock CLK, the control circuit 18 causes the address buffer register 17A to hold a bank address, an in-bank block address, and an in-block row address with providing an activated latch signal to the clock input of the address buffer register 17A.

At a time T1 when a predetermined time has elapsed from the time T0, a bit line precharge operation already finished, and the control circuit 18 provides a set signal to the RS flip-flops in word decoders, including the word decoder 11 in FIG. 3, of the bank 0 and the flip-flops in the direct-sense activation circuits, including the circuit 20, of the bank 0, thereby causing the voltage of the selected word line WL(0) to rise, and holding the block selection signal in the flip-flops, whereby the content of the memory cell row along the word line WL(0) is read out onto the bit lines including BL(0) and *BL(0).

Holding of the bank address of each activated bank is carried out in the control circuit 18 in FIG. 1.

At a time T2 when a predetermined time has elapsed from the time T1, the control circuit 18 activates the sense amplification circuits for the selected memory blocks, for example, all the sense amplification circuits in the sense circuit rows 12A and 12B in FIG. 1, whereby the voltages between the bit lines including BL(0) and *BL(0) are amplified. FIG. 7 shows a case where the bit lines BL(0) and *BL(0) become high and low, respectively.

Since the bank address, block address and word line selection of the activated bank 0 are held as described above, it is possible to perform a semi-parallel operation with activating other bank on the next rise of the clock CLK.

(2) Operation in Response to an Activation Command ACT (1)

In response to an issuance of an activation command ACT at a time U0 of the next rise of the clock CLK, the control circuit 18 causes the address buffer register 17A to hold a bank address, an in-bank block address and an in-block row address with providing an activated latch signal to the clock input of the address buffer register 17A. Operations at times U1 and U2 are the same as those at the above-described times T1 and T2, respectively. FIG. 7 shows a case where the bit lines BL(1) and *BL(1) become high and low, respectively, by amplification of the sense amplification circuit.

(3) Operation in Response to a Read Command READ(0)

In response to an issuance of a read command READ(0) at a time T3 of a rise of the clock CLK, the control circuit 18 causes the address buffer register 17B to hold a section address and an in-section column address with providing an activated latch signal to the clock input of the address buffer register 17B, and provides the address of the bank 0 held as described above to the 2-bit decoder 101 in FIG. 3. Further, the control circuit 18 causes a read signal RDZ(0) to rise. In response to a rise of the read signal RDZ(0), at a time T4, the direct-sense activation signals *RDX(0) corresponding to the selection block in the bank 0, for example, signals *RDX0 and *RDX1 in FIG. 2 falls, while the precharge of the data bus by the sense buffer circuit 15 is cancelled with a timing signal coming from the control circuit 18. At a time T5 when a predetermined time has elapsed from the time T4, the output CL(0) of the column decoder 13 becomes effective in a predetermined period of time from the time T5, whereby the data on the bit lines BL (0) and *BL(0) is read out onto the local data bus LDB.

For example, in FIG. 4, the column gates P1 and P2 of the direct-sense circuit 123 turn on in a state where the read-data bus lines RDB and *RDB are high and the bit lines BL0 and *BL0 are high and low, respectively, whereby positive charge on the read-data bus line *RDB flows via the column gate P1 and direct sense gate PR to the direct-sense driving line *RDX1, and the voltage of the read-data bus line *RDB is lowered. During the *RDX1 is low, since the direct-sense activation signal *RDX(1) of the bank 1 is high, no data collision occurs on the data bus.

The data on the local data bus LDB goes through the global data bus GDB, is further amplified by the sense buffer circuit 15, and is taken out via the I/O buffer gate circuit 19 as DATA.

In response to a fall in the column selection line CL (0), the data buses (local data bus LDB and global data bus GDB) are precharged to voltage Vii by the sense buffer circuit 15.

(4) Operation in Response to a Read Command READ(1)

In response to an issuance of a read command READ(1) at a time U3 of the next rise of the clock CLK, the control circuit 18 carries out operation for the bank 1 in the same manner as above-described operation for the bank 0 in response to the issuance of the read command READ(0). In FIG. 7, time points U3, U4 and U5 correspond to the time points T3, T4 and T5, respectively. Since the direct-sense activation signal *RDX(0) is high, no data collision on the global data bus GDB occurs.

(5) Operation in Response to a Precharge Command PRE(0)

In response to an issuance of a precharge command PRE (0) at a time T6 of the next rise of the clock CLK, the control circuit 18 provides a reset signal to the RS flip-flops in the word decoders, including the word decoder 11 in FIG. 3, of the bank 0 to lower the voltage of the selected word line. Next, the control circuit 18 causes the sense amplification circuits to become inactive, and further resets the bit line voltage to Vii/2 with making the bit line reset signal BRS high.

With such structure and operation, in FIG. 1, it is possible to commonly use the column decoder 13 and the sense buffer circuit 15 among the banks 0 through 3.

It is noted that in a case where the contents of the memory cells of the same row in the same bank are successively read out in every clock with changing column address, the direct-sense driving line is made low in this duration.

Second Embodiment

The number of sense circuits in one sense circuit row is, for example, 512 in actual example. Therefore the output load of the direct-sense activation circuit 20 in FIG. 5 is rather large and the operation from the start of direct-sense activation to actual activation thereof is delayed.

Figure 10:
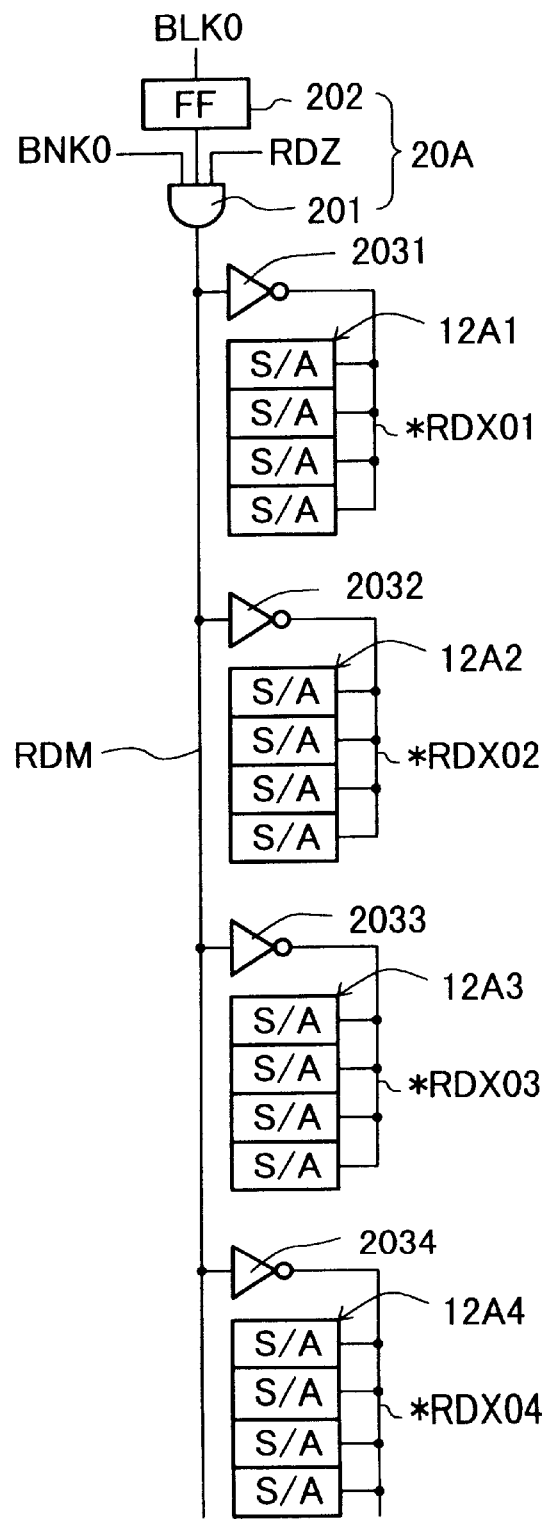
FIG. 10 is a diagram showing a circuit corresponding to FIG. 2, according to the second embodiment of the present invention.

Therefore, in the second embodiment of the present invention, as shown in FIG. 10, inverters 2031 through 2034 which are for amplification of the driving capacity and inverting logical value are dispersed and disposed for the respective sense circuit groups 12A1 through 12A4. The output RDM of the AND gate 201 in a circuit 20A is provided to the inverters 2031 through 2034, and the outputs of the inverters 2031 through 2034 are connected to the above-described direct-sense driving lines to the direct sense circuits in the sense circuit groups 12A1 through 12A4, respectively. *RDX01 through *RDX04 are direct-sense activation signals outputted from the inverters 2031 through 2034, respectively.

With such a structure, the direct-sense activation operation becomes faster than that of the first embodiment.

Figure 8:
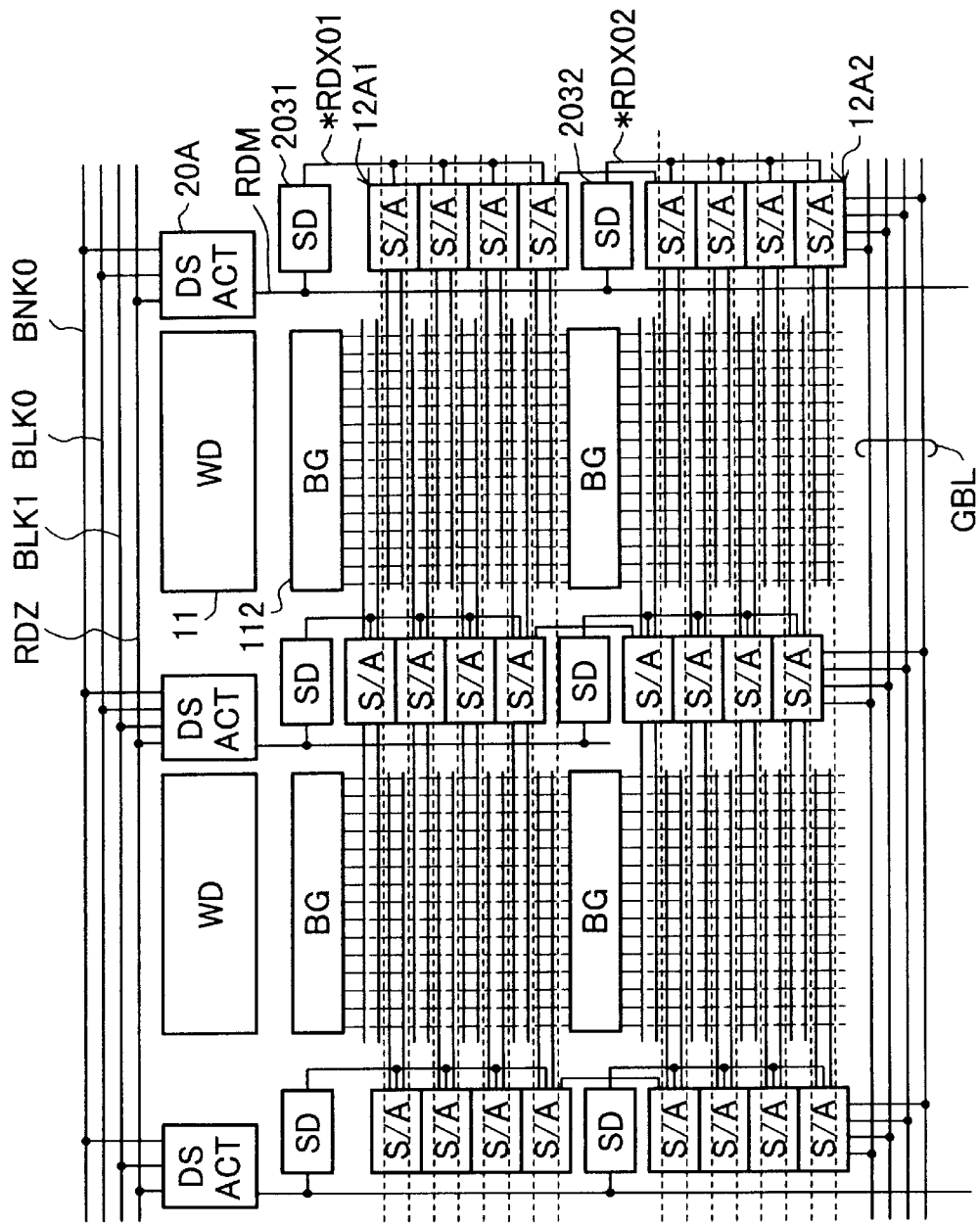
FIG. 8 is a block diagram showing a part corresponding to that of FIG. 2, according to the second embodiment of the present invention.
Figure 9:
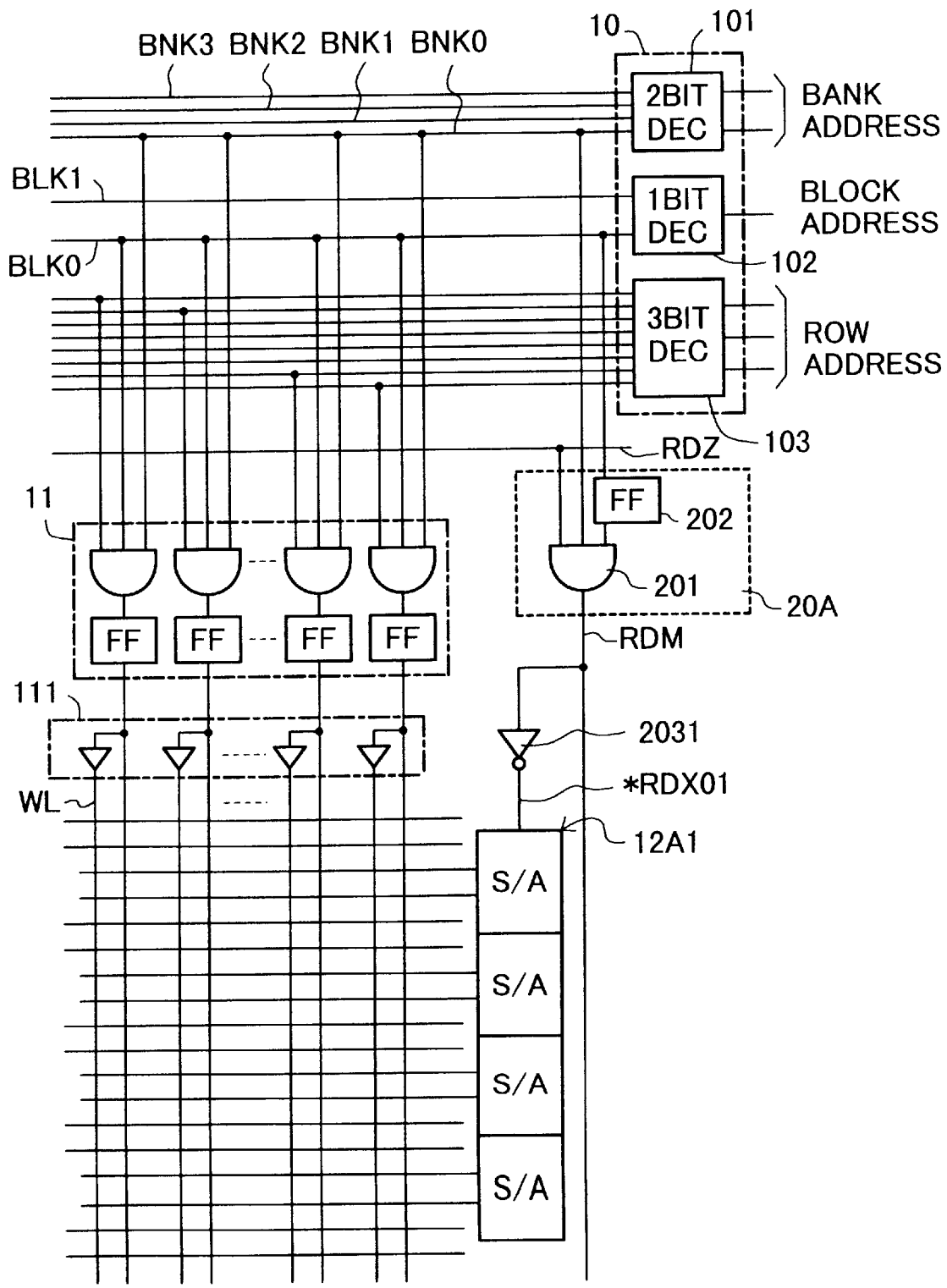
FIG. 9 is a circuit diagram showing a structure example of a part of FIG. 8.

FIG. 8 shows part corresponding to FIG. 2, in the second embodiment. FIG. 9 shows a structure example of part of FIG. 8.

Figure 11A:
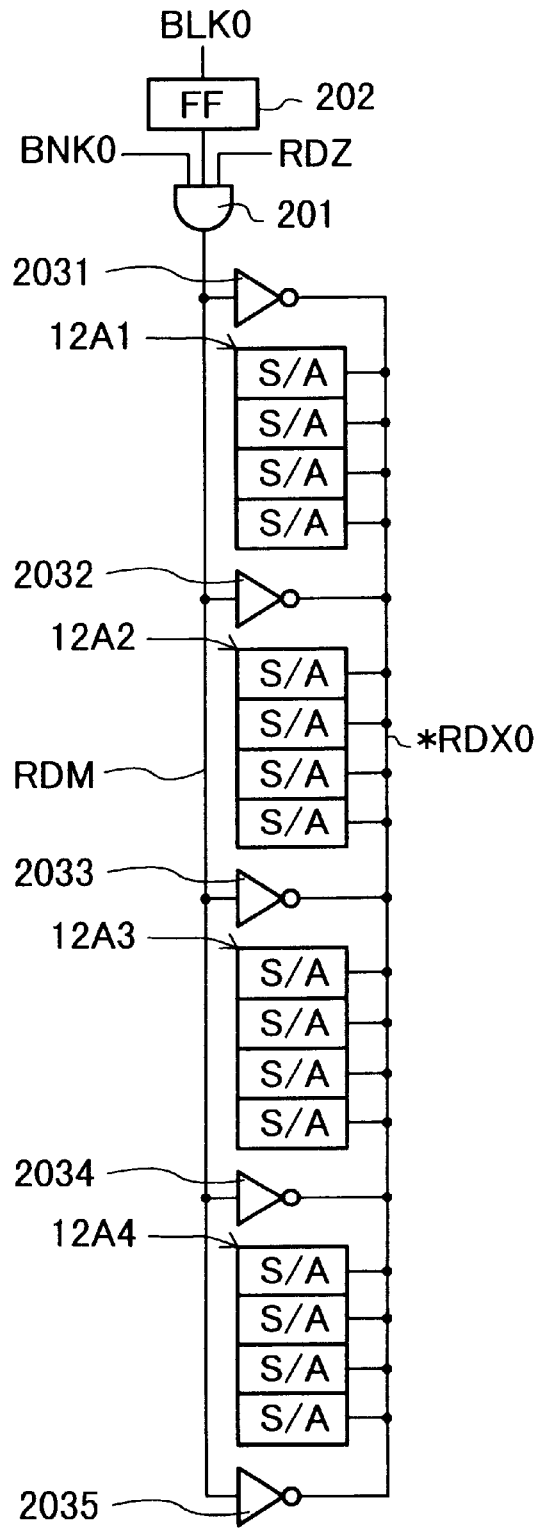
FIGS. 11(A) and 11(B) are diagrams showing modified circuits of FIG. 10.

FIGS. 11(A) and (B) each show modifications of the circuit of FIG. 10.

In FIG. 11(A), the inverters 2031 through 2035 are disposed so that they sandwich each of the sense circuit groups 12A1 through 12A4, and the output RDM of the AND gate 201 is provided to the inverters 2031 through 2035. The outputs of the inverters 2031 through 2035 are commonly connected and are commenced to the above-described direct-sense driving lines to the direct sense circuits in the sense circuit groups 12A1 through 12A4. It is enough that the drive capacity of each of the inverters 2031 and 2035 is half that of any of the inverters 2032 and 2034 which are identical to each other.

In the structure of FIG. 10, although it is not possible to add one inverter, according to this modification, an inverter 2035 can be added and effectively utilized. Therefore direct-sense activation of FIG. 11(A) can be made faster than that of FIG. 10.

Figure 11B:
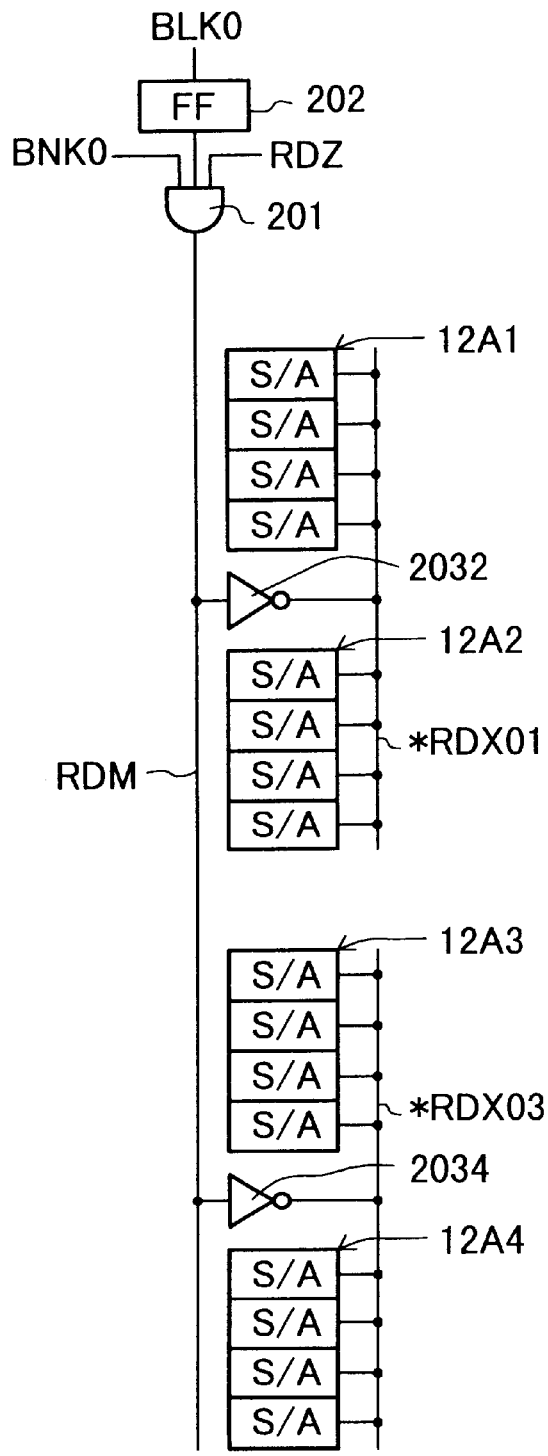

In FIG. 11(B), the inverter 2032 is disposed between the sense circuit groups 12A1 and 12A2, and the inverter 2034 is disposed between the sense circuit groups 12A3 and 12A4. The output RDM of the AND gate 201 is provided to the inverters 2032 and 2034. The output of the inverter 2032 is connected to the above-described direct-sense driving lines to the sense circuit groups 12A1 and 12A2, and the output of the inverter 2034 is connected to the direct-sense driving lines to the sense circuit groups 12A3 and 12A4. *RDX01 and *RDX03 are direct-sense activation signals outputted from the inverters 2032 and 2034, respectively.

According to this modification, since there is a space on one side of each of the sense circuit groups 12A1 and 12A3 in the lengthwise direction, other circuits can be arranged in the spaces.

Figure 12A:
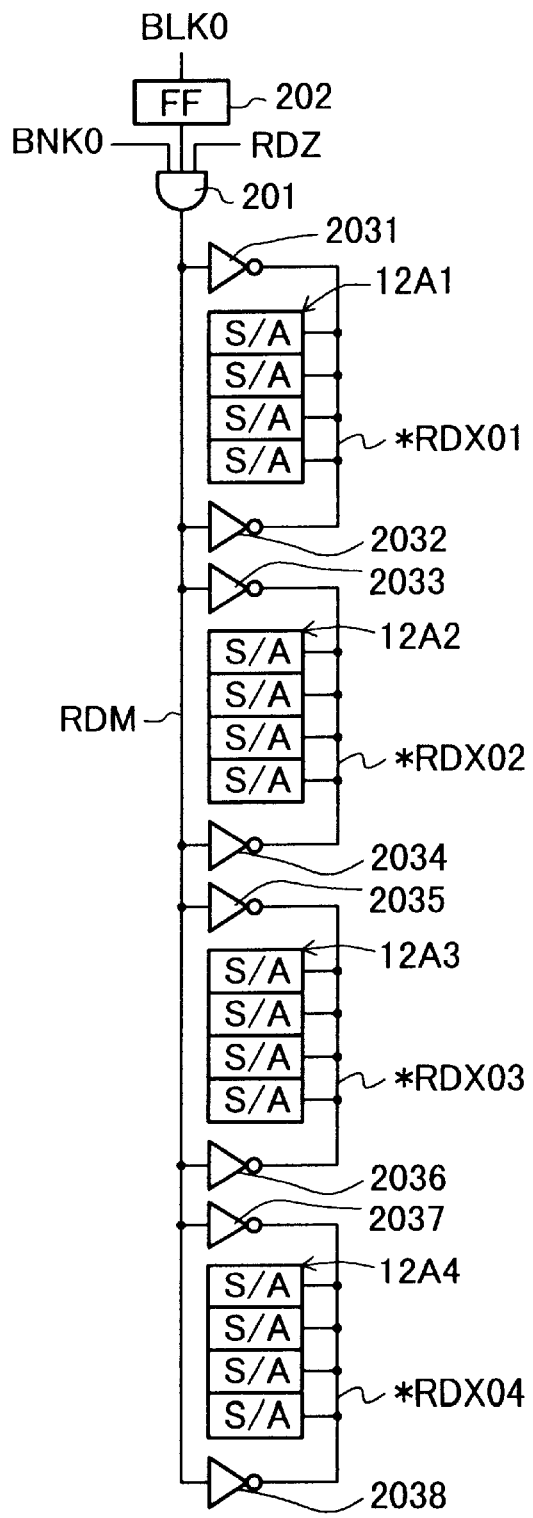
FIGS. 12(A) and 12(B) are diagrams showing other modified circuits of FIG. 10.

FIGS. 12(A) and (B) each show other modifications of the circuit of FIG. 10.

In FIG. 12(A), there are provided inverters at both sides of each of the sense circuit groups 12A1 through 12A4 in the lengthwise direction. The output RDM of the AND gate 201 is provided to the inverters 2031 through 2038, and the outputs thereof are connected to the direct-sense driving lines in the sandwiched sense circuit group.

According to this modification, the direct-sense activation can be made faster than in the case of FIG. 11(A).

Figure 12B:
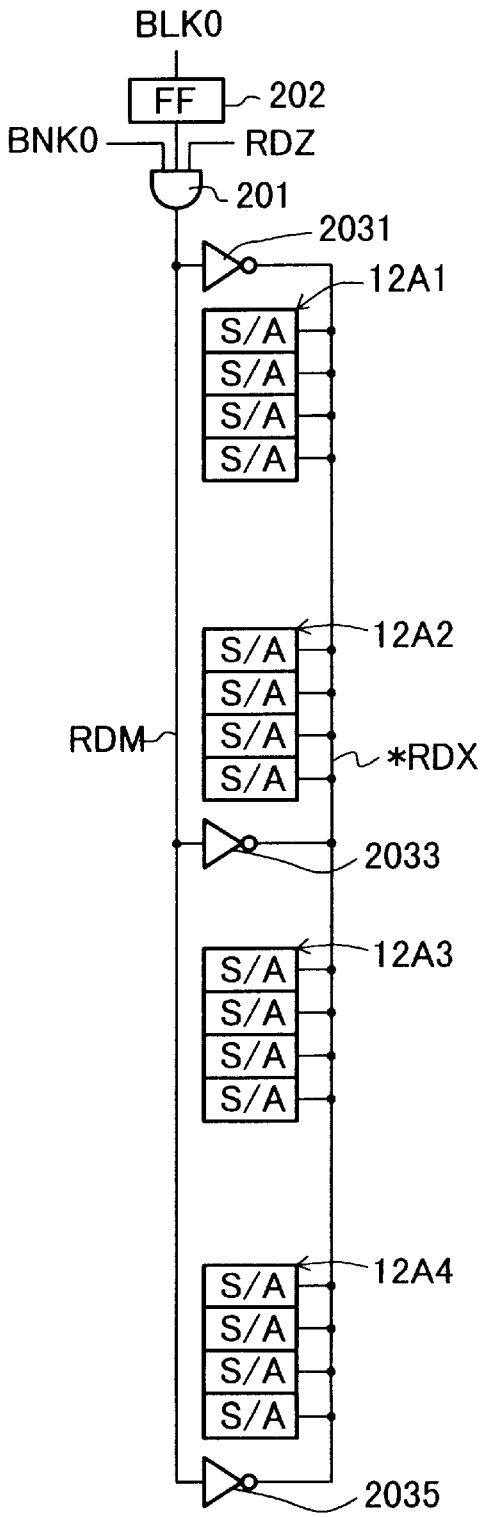

In FIG. 12(B), the structure is such that the inverters 2032 and 2034 are omitted from that of FIG. 11(A).

According to this modification, the direct-sense activation can be made faster than in the case of FIG. 11(B).

Third Embodiment

Even if the driven object is divided as shown in FIG. 10, since the direct-sense driving lines to the sense circuits not used are driven, wasteful power is consumed.

Figure 14:
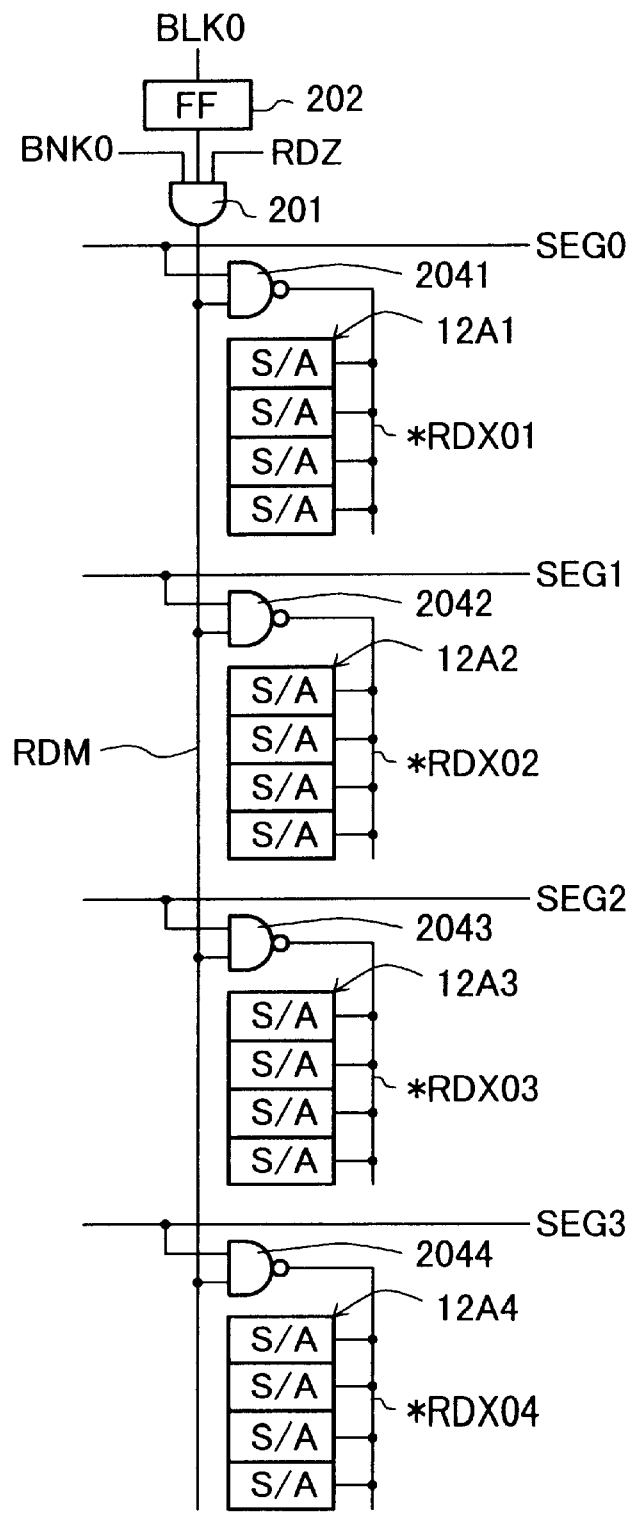
FIG. 14 is a diagram showing a circuit corresponding to FIG. 5, according to the third embodiment of the present invention.

Therefore, in the third embodiment of the present invention, as shown in FIG. 14, NAND gates 2041 through 2044 are used instead of the inverters 2031 through 2034 in FIG. 10. The output RDM of the AND gate 201 is provided to one input of each of the NAND gates 2041 through 2044, while segment selection signals SEG0 through SEG3 to make the respective outputs thereof valid or invalid are provided to the other inputs of the NAND gates 2041 through 2044, respectively.

For example, if a segment 0 is selected, only SEG0 of the segment selection signals SEG0 through SEG3 becomes high, and the NAND gate 2041 functions as an inverter, that is, the output of the NAND gate 2041 is valid, while the outputs of the NAND gates 2042 through 2044 keep high regardless of the output of AND gate 201 and becomes invalid.

In this way, since only the direct-sense driving lines to the sense circuit group of the selected segment 0 are driven, power consumption can be decreased.

Figure 15:
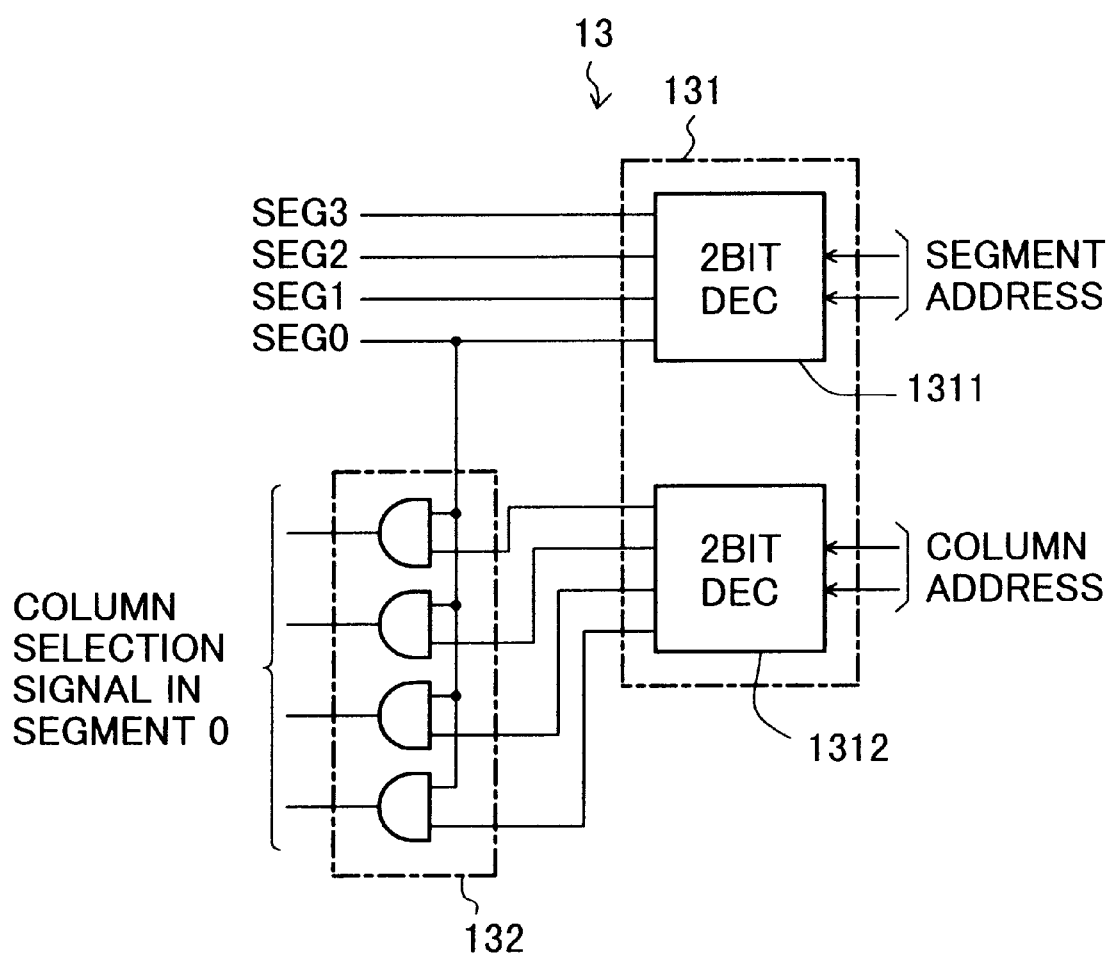
FIG. 15 is a circuit diagram showing a structure example of a part of a column decoder which generates segment selection signals.

FIG. 15 shows a structure example of part of the column decoder 13, which generates segment selection signals SEG0 through SEG3. In FIG. 15, it is assumed that the address buffer register 17B is of four bits for simplification.

The upper two bits and lower two bits of the four bits are provided to the 2-bit decoders 1311 and 1312 of the predecoder 131 as a segment address and an in-segment column address, respectively. The segment selection signals SEG0 through SEG3 are outputted from the 2-bit decoder 1311. The segment selection signal SEG0 together with the output of the 2-bit decoder 1312 is provided to the gate circuit 132, whereby column selection signals in the segment 0 are generated. This is the same as those for the column selection signals to the segments 1 through 3 (not shown).

Figure 13:
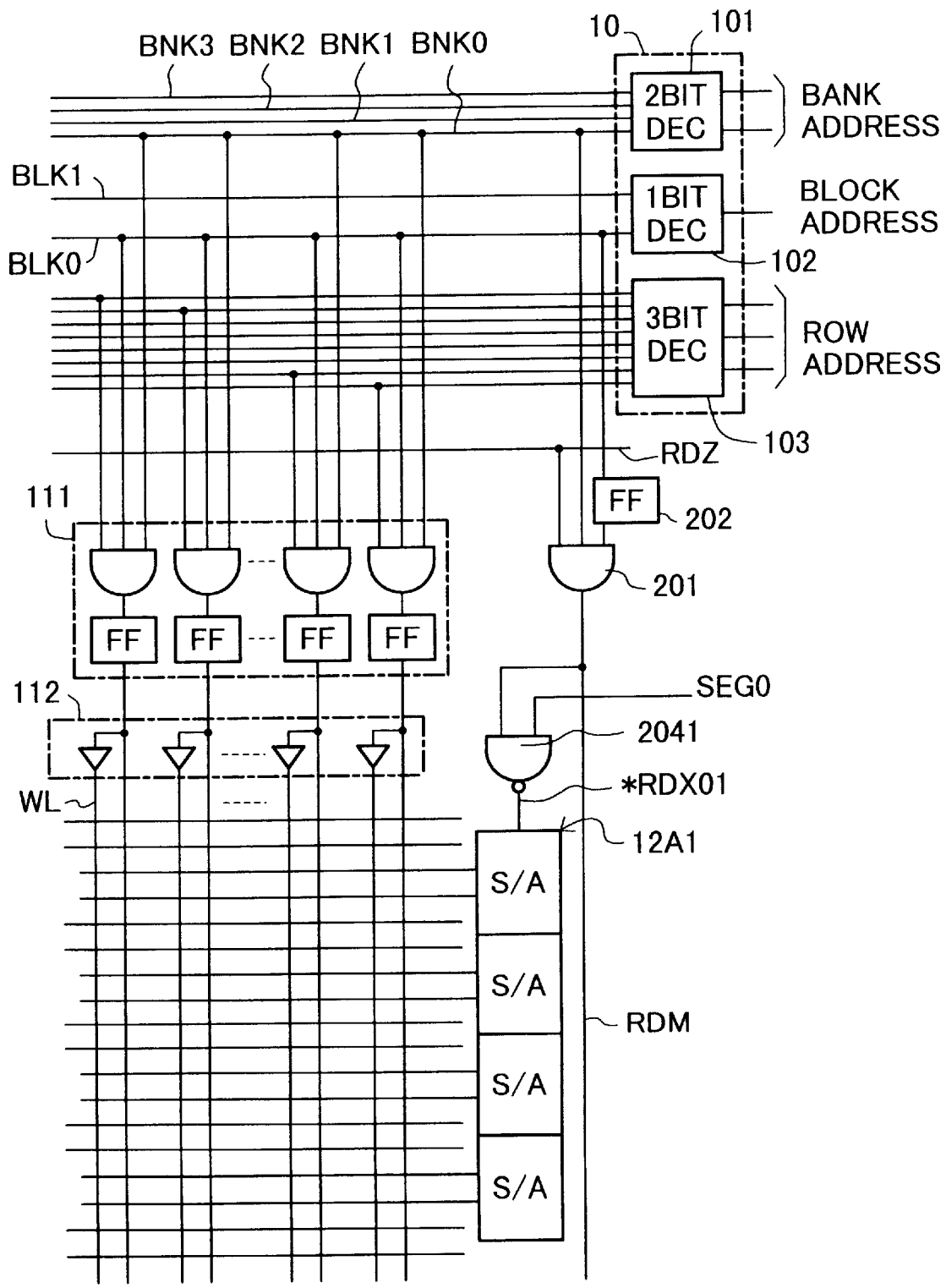
FIG. 13 is a diagram showing a circuit corresponding to FIG. 3, according to the third embodiment of the present invention.
Figure 16:
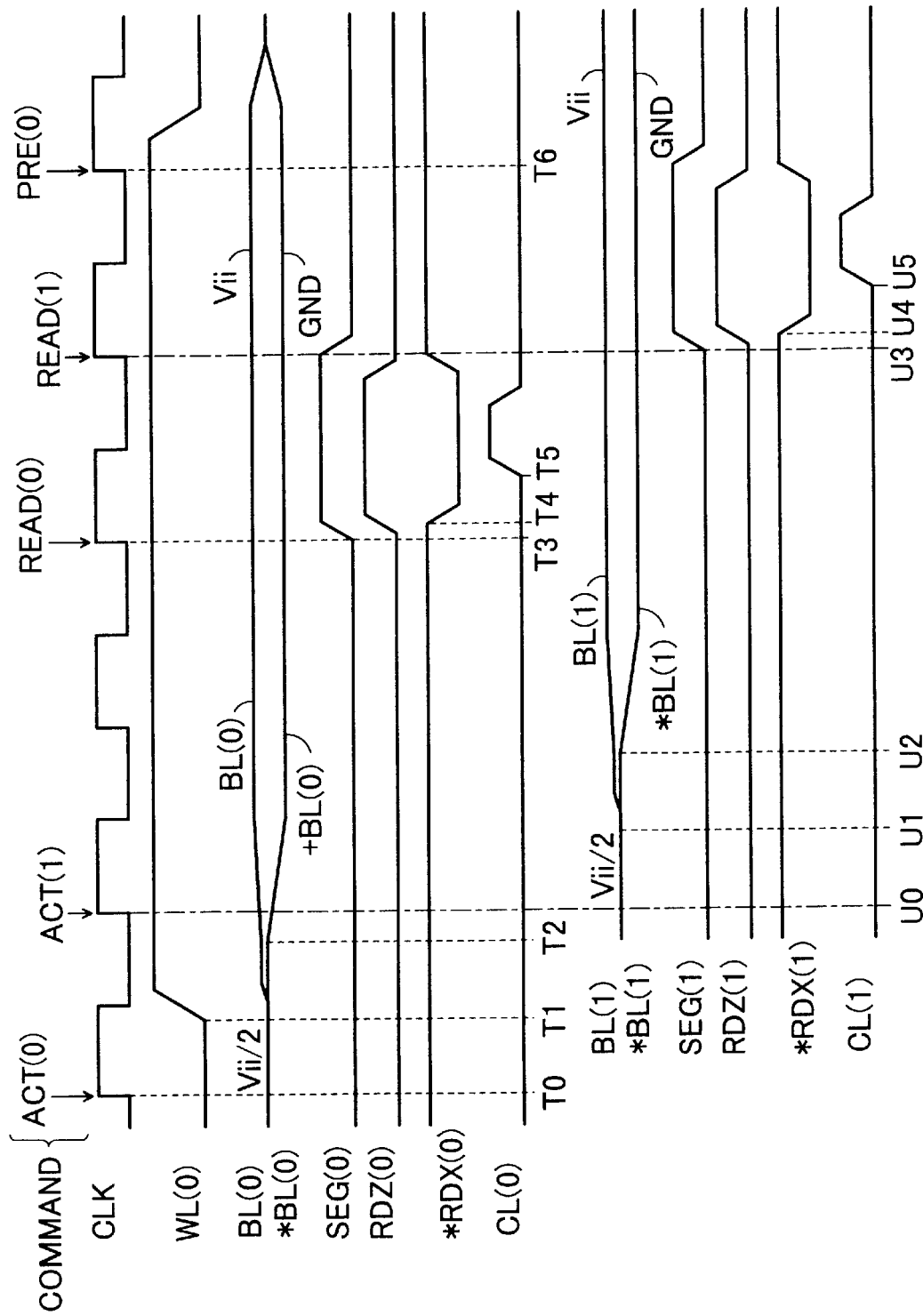
FIG. 16 are time charts corresponding to FIG. 7, according to the third embodiment of the present invention.

FIG. 13 shows a circuit of the third embodiment, which corresponds to FIG. 3. FIG. 16 show time charts corresponding to FIG. 7.

In FIG. 16, in Response to a Read Command READ(0) at a time T3 of a rise of the clock CLK, the control circuit 18 of FIG. 1 provides an activated latch signal to the clock input of the address buffer register 17B, whereby the segment selection signal SEG(0) changes to high. In Response to a Read Command READ(1) at a time U3 of the next rise of the clock CLK, the control circuit 18 provides an activated latch signal to the clock input of the address buffer register 17B, whereby the segment selection signal SEG(0) changes to low and the segment selection signal SEG(1) changes to high. All other points are identical to those in FIG. 7.

Figure 17:
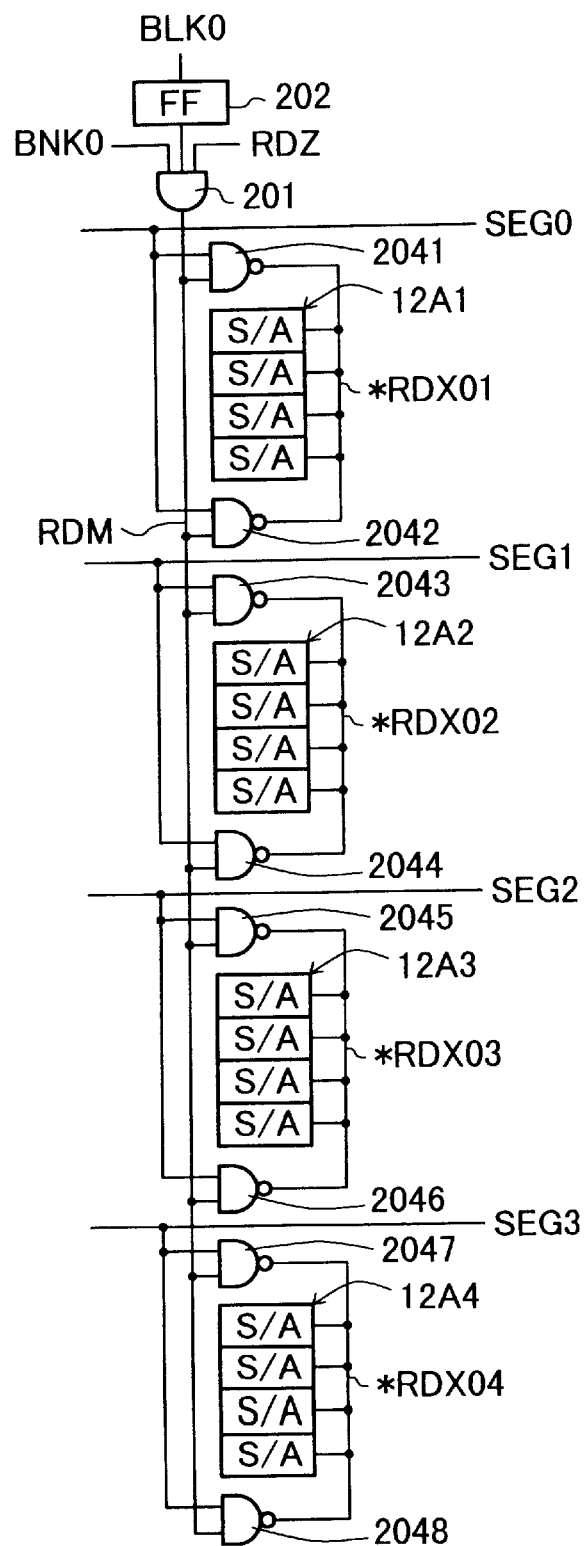
FIG. 17 is a diagram showing a modified circuit of FIG. 14.
Figure 18:
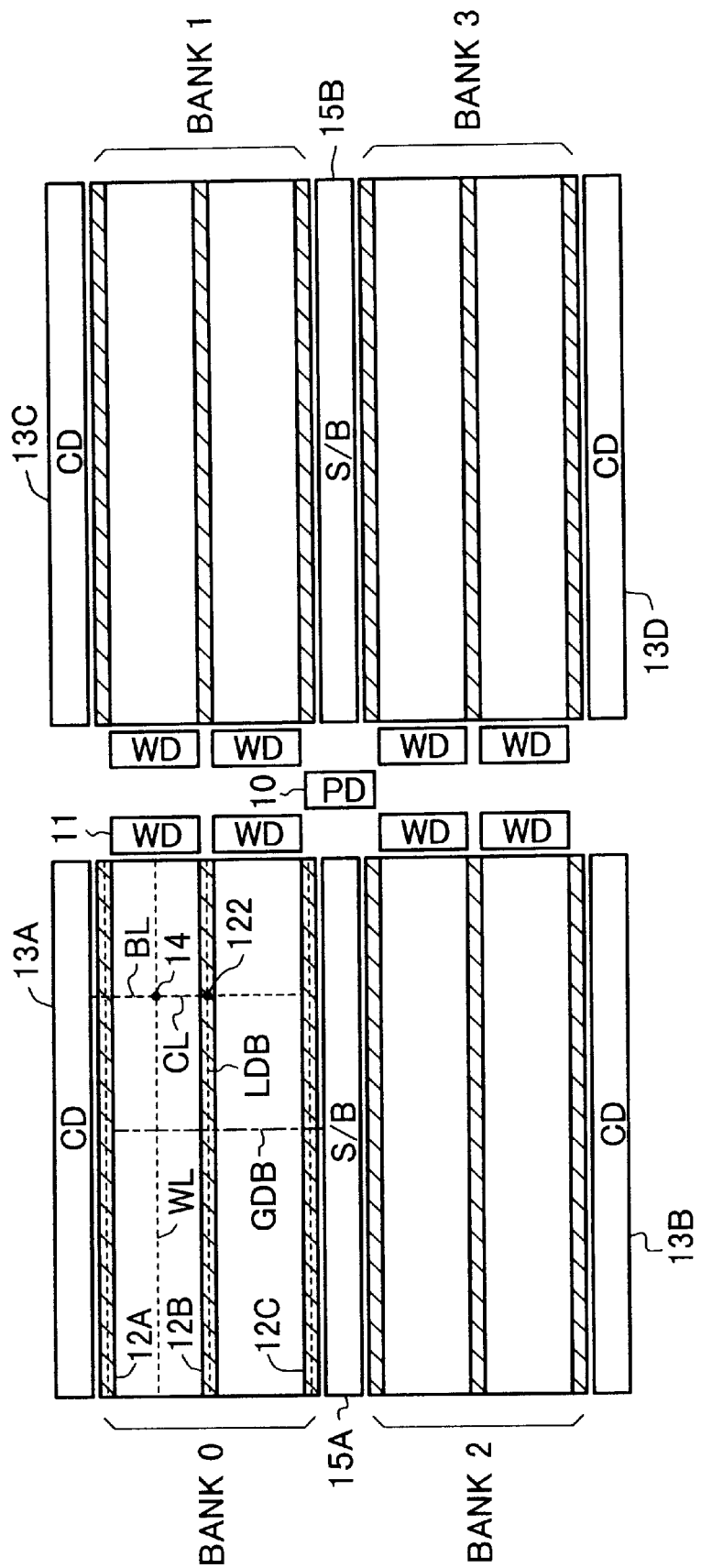
FIG. 18 is a schematic layout pattern of a core part of a prior art synchronous DRAM.
Figure 19:
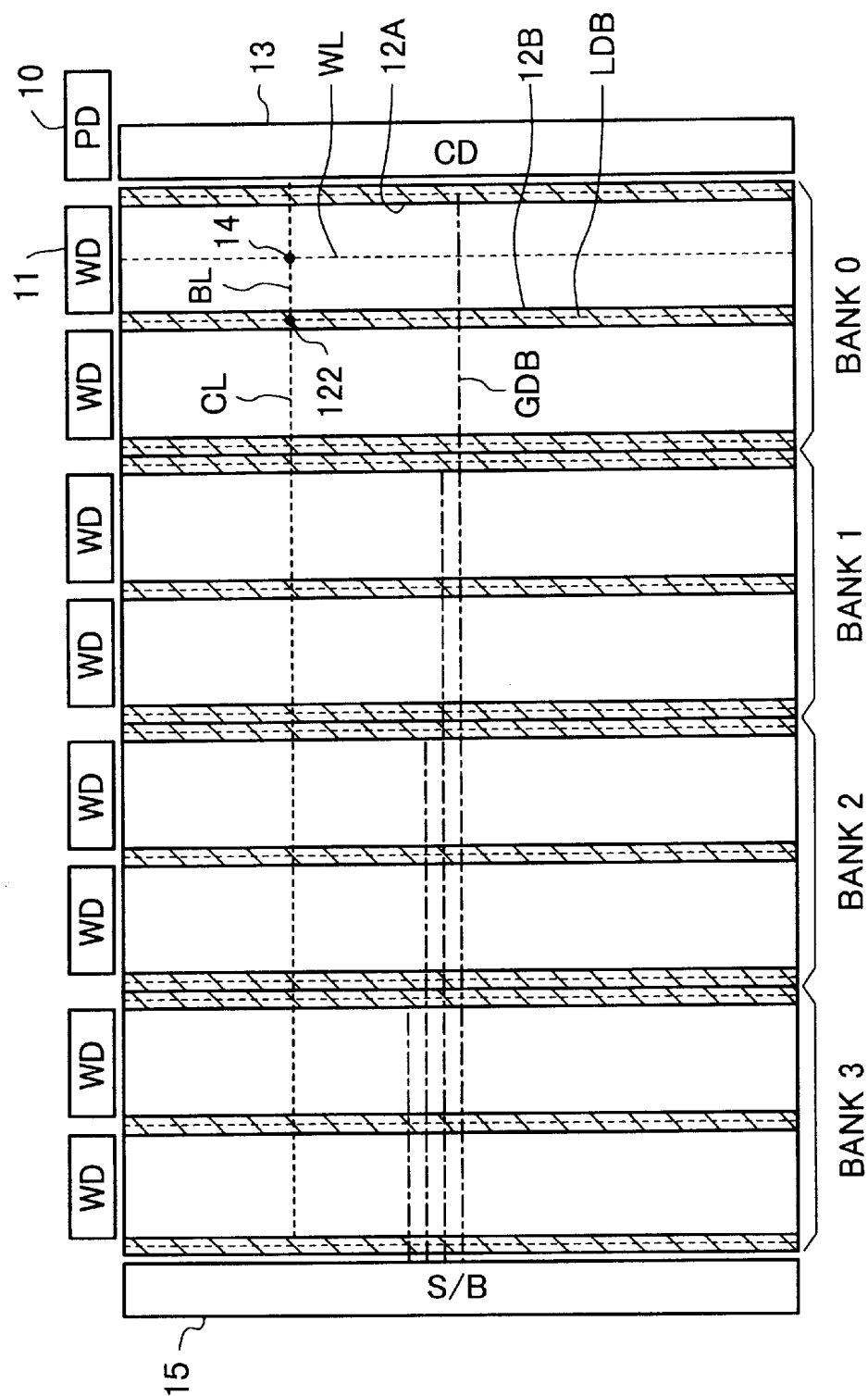
FIG. 19 is a schematic layout pattern showing the first improvement on FIG. 18.
Figure 20:
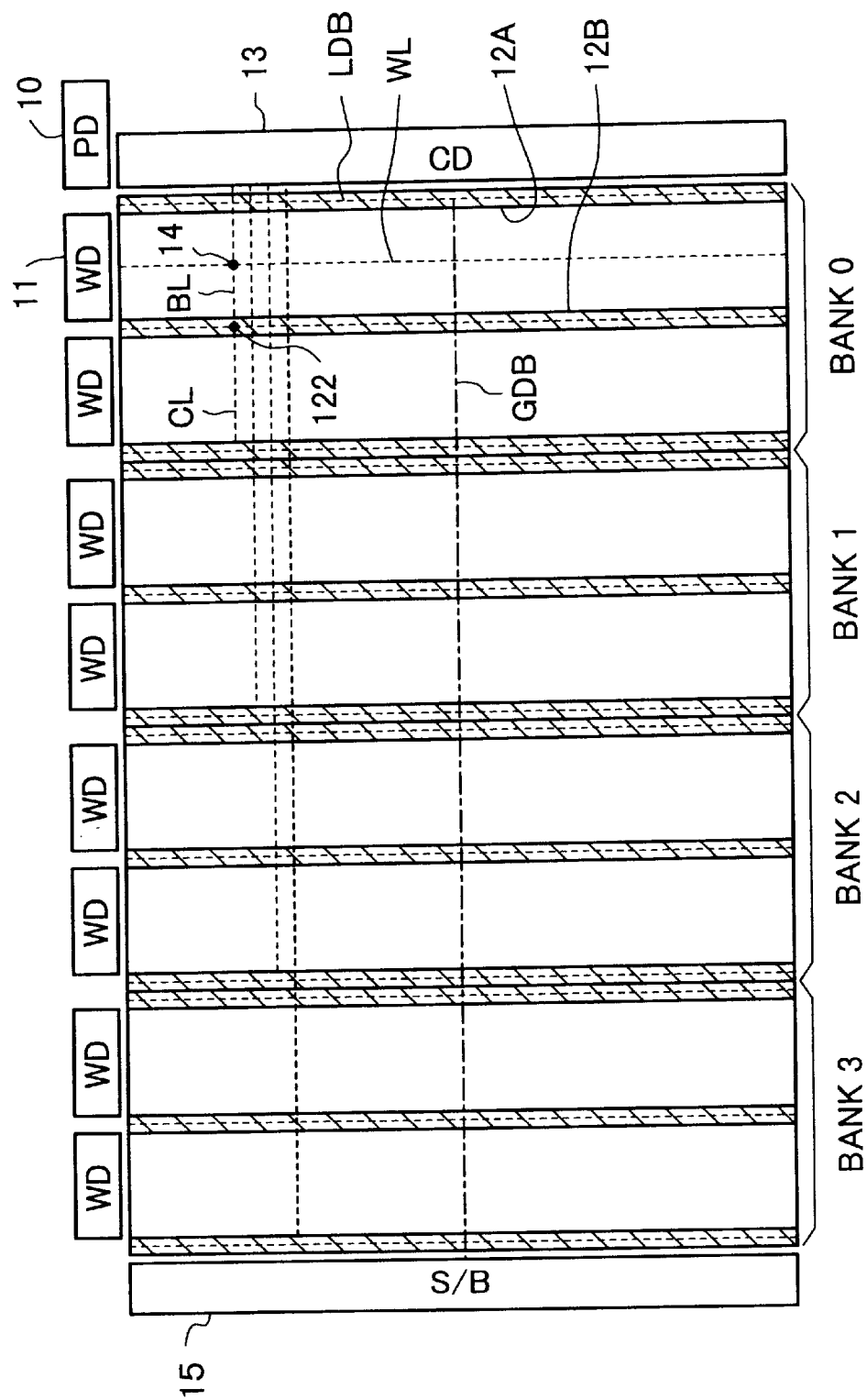
FIG. 20 is a schematic layout pattern showing the second improvement on FIG. 18.
Figure 21:
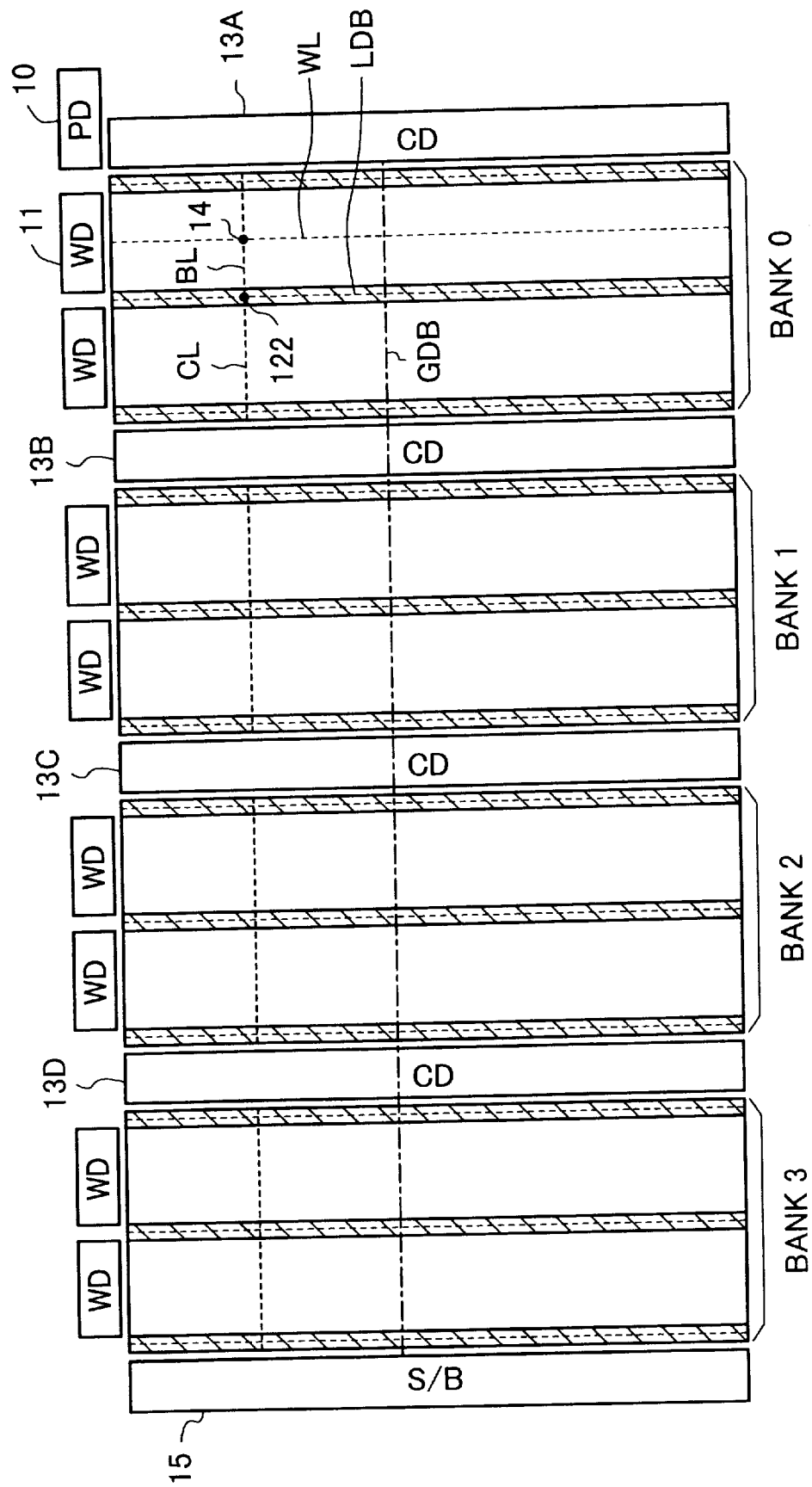
FIG. 21 is a schematic layout pattern showing the third improvement on FIG. 18.

FIG. 17 shows a modification of the circuit of FIG. 14.

In this circuit, the inverters 2031 through 2038 in FIG. 12(A) are replaced with NAND gates 2041 through 2048, and further the idea of FIG. 14 is employed. For example, in a case where the segment 0 is selected, only the NAND gates 2041 and 2042 disposed on both sides of the sense circuit group 12A1 in the lengthwise direction, among the NAND gates 2041 through 2048, function as inverters. Other various modifications can be considered, but since they can be easily understood from the above description, the explanation thereof is omitted herein.

Although preferred embodiments of the present invention has been described, it is to be understood that the invention is not limited thereto and that various changes and modifications may be made without departing from the spirit and scope of the invention.

For example, a direct-sense activation circuit may be provided for each of the memory blocks, and may be commonly used in the sense circuit rows on both sides of the memory block. The direct-sense activation circuit may be disposed so that the memory block is placed between the direct-sense activation circuit and the word decoder.

One bank may have only one memory block. In this case, bank 0=block 0.

In a case of random access, it is preferable that the period in which the direct-sense driving line is activated is within one clock cycle. However, even if the period exceeds one clock cycle, it is possible to avoid a data collision on the data bus by lengthening the period from the beginning of activating one bank until the beginning of activating another bank.

In FIGS. 7 and 16, since there are three clock cycles from the issuance of the activation command ACT(0) to the issuance of the read command read(0), it is possible to successively activate only three banks. However, it is clear that four clock cycles of that may be employed to enable to successively activate banks 0 through 3.

In the above-described embodiment, although a description was given of the case where the direct-sense driving line is active when it is low, the reverse is considered. For example, in the direct sense circuit 123 in FIG. 4, the NM0S transistors P1, P2, PR and PRX may be replaced by PM0S transistors and the precharge voltage of the read-data bus lines RDB and *RDB may be at 0 V, whereby the active and inactive voltages of the direct-sense driving line in the above-described embodiments is reversed. In general, an inactive voltage of the direct-sense driving line may be such one that the column gate is off even if the column selection line is active with the read-data bus line being at a precharged voltage, and an active voltage of the direct-sense driving line may be such another that the column gate is on if the column selection line is active with the read-data bus line being at the precharged voltage.

As a memory device to which the present invention is applied, the sense amplification circuit is not requisite, and further a single bit line in stead of a bit line pair may be employed.

What is claimed is:

1. A memory device comprising:
   a plurality of memory blocks to be activated independently to each other, each memory block having memory cells arranged in rows and columns and including a bit line coupled to a plurality of memory cells;
   a direct sense circuit coupled between a read-data bus line and said bit line, said direct sense circuit being activated with activating a direct-sense driving line;
   a control circuit for generating a read signal activated for a predetermined time in response to a read command; and
   a direct-sense activation circuit for activating said direct-sense driving line in response to said activated read signal when a corresponding one of said memory blocks is activated.

2. A memory device according to claim 1, wherein said direct sense circuit comprise:
   a column gate having a control input and a current path, said control input thereof being coupled to a column selection line; and
   a direct sense gate having a control input and a current path, said control input thereof being coupled to said bit line,
   wherein said current paths of said column gate and said direct sense gate are coupled in series between said direct-sense driving line and said read-data bus line.

3. A memory device according to claim 2,
   wherein an inactive voltage of said direct-sense driving line is such one that said column gate is off even if said column selection line is active with said read-data bus line being at a precharged voltage, and
   wherein an active voltage of said direct-sense driving line is such another that said column gate is on if said column selection line is active with said read-data bus line being at said precharged voltage.

4. A memory device according to claim 2, wherein a period of time from activation of one of said memory blocks to activation of another of said memory blocks is equal to or longer than said predetermined time.

5. A memory device according to claim 4, further comprising a sense amplifier circuit for amplifying a signal on said bit line,
   wherein each of said memory blocks is disposed between adjacent two sense circuit rows, said adjacent two sense circuit rows being activated when the memory block therebetween is selected, each sense circuit row including said direct sense circuit and said sense amplifier circuit for each of said columns, and
   wherein said direct-sense activation circuit is provided for each of said sense circuit rows.

6. A memory device according to claim 5,
   wherein each of said column gate and said direct sense gate each is a M0S transistor, and
   wherein an inactive voltage of said direct-sense driving line is a precharged voltage of said read-data bus line.

7. A memory device according to claim 6, wherein said direct-sense activation circuit is a logic circuit having inputs coupled to receive a block selection signal and said read signal, and said direct-sense driving line is coupled to an output of said logic circuit.

8. A memory device according to claim 7, wherein said direct-sense activation circuit comprises:
   a logic circuit having inputs coupled to receive said block selection signal and said read signal; and
   a plurality of buffer circuits having an input coupled to receive an output signal of this logic circuit, an output of each buffer circuit being coupled to said direct-sense driving lines, said buffer circuits being dispersed and disposed in corresponding one of said sense circuit rows.

9. A semiconductor according to claim 8, wherein outputs of said buffer circuits are independent to each other.

10. A memory device according to claim 8, wherein part or all of outputs of said buffer circuits in one of said sense circuit rows are connected to each other.

11. A memory device according to claim 8, wherein each of said buffer circuits is a logic gate having an input coupled to receive a segment selection signal which enables or disables an output thereof, segment selection signals being obtained by decoding upper bits of a column address.

12. A memory device according to claim 5, further comprising:
   a column decoder coupled to said column selection line, said column decoder being common to said memory blocks;
   a sense buffer circuit coupled via a global data bus line to said read-data bus line, said sense buffer circuit being common to said memory blocks; and
   word decoders for respective said memory blocks, each for activating a selected word line to select a row of said memory cells, disposed on a side of said respective memory blocks in lengthwise direction thereof, wherein said memory blocks are arrayed in a direction perpendicular to the lengthwise direction of said sense circuit rows, and are disposed between said column decoder and said sense buffer circuit.

13. A memory device according to claim 12, wherein said direct-sense activation circuit is disposed on one side of said corresponding sense circuit row in its lengthwise direction.

14. A semiconductor device including a memory circuit comprising:

a plurality of memory blocks to be activated independently to each other, each memory block having memory cells arranged in rows and columns and including a bit line coupled to a plurality of memory cells;

a direct sense circuit coupled between a read-data bus line and said bit line, said direct sense circuit being activated with activating a direct-sense driving line;

a control circuit for generating a read signal activated for a predetermined time in response to a read command; and a direct-sense activation circuit for activating said direct-sense driving line in response to said activated read signal when a corresponding one of said memory blocks is activated, wherein said direct sense circuit comprise:

a column gate having a control input and a current path, said control input thereof being coupled to a column selection line; and a direct sense gate having a control input and a current path, said control input thereof being coupled to said bit line, wherein said current paths of said column gate and said direct sense gate are coupled in series between said direct-sense driving line and said read-data bus line.

* * * * *